United States Patent
Kawashima

(10) Patent No.: US 10,943,877 B2
(45) Date of Patent: Mar. 9, 2021

(54) SEMICONDUCTOR DEVICE

(71) Applicant: DENSO CORPORATION, Kariya (JP)

(72) Inventor: Takanori Kawashima, Anjo (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/285,837

(22) Filed: Feb. 26, 2019

(65) Prior Publication Data

US 2019/0318999 A1 Oct. 17, 2019

(30) Foreign Application Priority Data

Apr. 11, 2018 (JP) .............................. JP2018-076191

(51) Int. Cl.
| | |
|---|---|
| *H01L 23/62* | (2006.01) |
| *H01L 23/31* | (2006.01) |
| *H01L 25/07* | (2006.01) |
| *H01L 23/50* | (2006.01) |
| *H01L 23/367* | (2006.01) |

(52) U.S. Cl.
CPC .......... *H01L 23/62* (2013.01); *H01L 23/3107* (2013.01); *H01L 23/3675* (2013.01); *H01L 23/50* (2013.01); *H01L 25/072* (2013.01)

(58) Field of Classification Search
CPC .. H01L 23/62; H01L 23/3107; H01L 23/3675
See application file for complete search history.

(56) References Cited

U.S. PATENT DOCUMENTS

| | | | |
|---|---|---|---|
| 5,691,884 A | 11/1997 | Soyano et al. | |
| 7,224,145 B2 | 5/2007 | Pierret et al. | |
| 7,843,700 B2 | 11/2010 | Fukuda et al. | |
| 8,884,411 B2 | 11/2014 | Kadoguchi et al. | |
| 9,325,257 B2 | 4/2016 | Okayama | |
| 10,236,806 B2 | 3/2019 | Holzer et al. | |
| 2007/0057373 A1 | 3/2007 | Okumura et al. | |
| 2009/0231811 A1 | 9/2009 | Tokuyama et al. | |
| 2010/0084183 A1 | 4/2010 | Ishida et al. | |
| 2015/0131232 A1 | 5/2015 | Ishino et al. | |

(Continued)

FOREIGN PATENT DOCUMENTS

| | | |
|---|---|---|
| JP | 2010-034347 A | 2/2010 |
| JP | 2013-93343 A | 5/2013 |

(Continued)

OTHER PUBLICATIONS

U.S. Appl. No. 16/253,710, filed Jan. 22, 2019 in the name of Kawashima.

(Continued)

*Primary Examiner* — Douglas M Menz
(74) *Attorney, Agent, or Firm* — Oliff PLC

(57) ABSTRACT

A semiconductor device may include at least one semiconductor chip, an encapsulant encapsulating the at least one semiconductor chip, a first power terminal connected to the at least one semiconductor chip within the encapsulant, and a second power terminal electrically connected to the first power terminal via the at least one semiconductor chip within the encapsulant. The first power terminal and the second power terminal each may have a plate shape and may be at least partly opposed to each other within the encapsulant

16 Claims, 20 Drawing Sheets

(56) References Cited

U.S. PATENT DOCUMENTS

| | | |
|---|---|---|
| 2015/0155797 A1 | 6/2015 | Okayama |
| 2016/0064312 A1 | 3/2016 | Bando |
| 2017/0278774 A1 | 9/2017 | Hayashi et al. |
| 2017/0287821 A1 | 10/2017 | Choi et al. |
| 2018/0218960 A1 | 8/2018 | Takahagi et al. |
| 2018/0226383 A1* | 8/2018 | Yamaguchi ............. H02M 7/48 |
| 2018/0366409 A1 | 12/2018 | Kuwabara et al. |
| 2019/0221490 A1 | 7/2019 | Fujita |
| 2019/0221549 A1 | 7/2019 | Hayashi et al. |
| 2019/0237453 A1 | 8/2019 | Nagase |
| 2019/0244888 A1 | 8/2019 | Kawashima |
| 2019/0318999 A1 | 10/2019 | Kawashima |

FOREIGN PATENT DOCUMENTS

| | | |
|---|---|---|
| JP | 2014-011338 A | 1/2014 |
| JP | 5551808 B2 | 7/2014 |
| JP | 2014-183078 A | 9/2014 |
| JP | 5914867 B2 | 5/2016 |
| JP | 2016-197706 A | 11/2016 |
| JP | 2017-28105 A | 2/2017 |
| JP | 2017-224751 A | 12/2017 |
| JP | 2018-67657 A | 4/2018 |

OTHER PUBLICATIONS

Korean written opinion of KR 10-2019-0012363 (dated Jul. 2020).
Sep. 2, 2020 Office Action issued in U.S. Appl. No. 16/253,710.
Cottet et al., "Numerical Comparison of Packaging Technologies for Power Electronics Modules", Power Electronics Specialist Conference 2005, PESC '05, IEEE 36th, IEEE, Piscataway NJ, pp. 2187-2193, doi: 1 0.1109/ PESC.2005.1581936, Jan. 1, 2005 (Year: 2005).

* cited by examiner

SEMICONDUCTOR DEVICE

CROSS-REFERENCE

This application claims priority to Japanese Patent Application No. 2018-076191, filed on Apr. 11, 2018, the entire contents of which are incorporated herein by reference.

TECHNICAL FIELD

The technology disclosed herein relates to a semiconductor device.

BACKGROUND

Japanese Patent Application Publication No. 2017-224751 describes a semiconductor device. This semiconductor device includes semiconductor chips, an encapsulant encapsulating the semiconductor chips, and a first power terminal and a second power terminal connected to the semiconductor chips within the encapsulant. The first power terminal and the second power terminal are connected to each other via the semiconductor chips, and currents in opposite directions to each other flow through these power terminals, respectively.

SUMMARY

In a semiconductor device, surge voltage may be generated in a case where current that flows in the semiconductor device abruptly changes. The surge voltage may cause, for example, malfunctions of semiconductor chips and unnecessary electric-power consumption, and hence is desired to be suppressed. Reduction of inductance in the semiconductor device is effective in suppressing the surge voltage. The present disclosure provides a technology that enables suppression of surge voltage by reducing inductance in a semiconductor device.

A semiconductor device disclosed herein may comprise at least one semiconductor chip, an encapsulant encapsulating the at least one semiconductor chip, a first power terminal connected to the at least one semiconductor chip within the encapsulant and exposed to outside of the encapsulant, and a second power terminal electrically connected to the first power terminal via the at least one semiconductor chip within the encapsulant and exposed to the outside of the encapsulant. The first power terminal and the second power terminal each may have a plate shape and be at least partly opposed to each other within the encapsulant.

In the above-described semiconductor device, the first power terminal and the second power terminal are electrically connected to each other via the at least one semiconductor chip. Thus, currents in opposite directions to each other flow through the first power terminal and the second power terminal, respectively. At this time, since the first power terminal and the second power terminal each have the plate shape and are at least partly opposed to each other, a magnetic field that is generated by the current through the first power terminal and a magnetic field that is generated by the current through the second power terminal cancel out each other. Due to this, the magnetic fields that are generated around the first power terminal and the second power terminal are suppressed, and hence inductances of the first power terminal and the second power terminal are significantly reduced. Here, as a distance between the first power terminal and the second power terminal becomes shorter, the inductances of the first power terminal and the second power terminal are reduced more. In this regard, when the first power terminal and the second power terminal are opposed to each other within the encapsulant, insulating property between the first power terminal and the second power terminal can be maintained, and at the same time, the distance between the first power terminal and the second power terminal can be sufficiently reduced.

DETAILED DESCRIPTION

Figure 1:
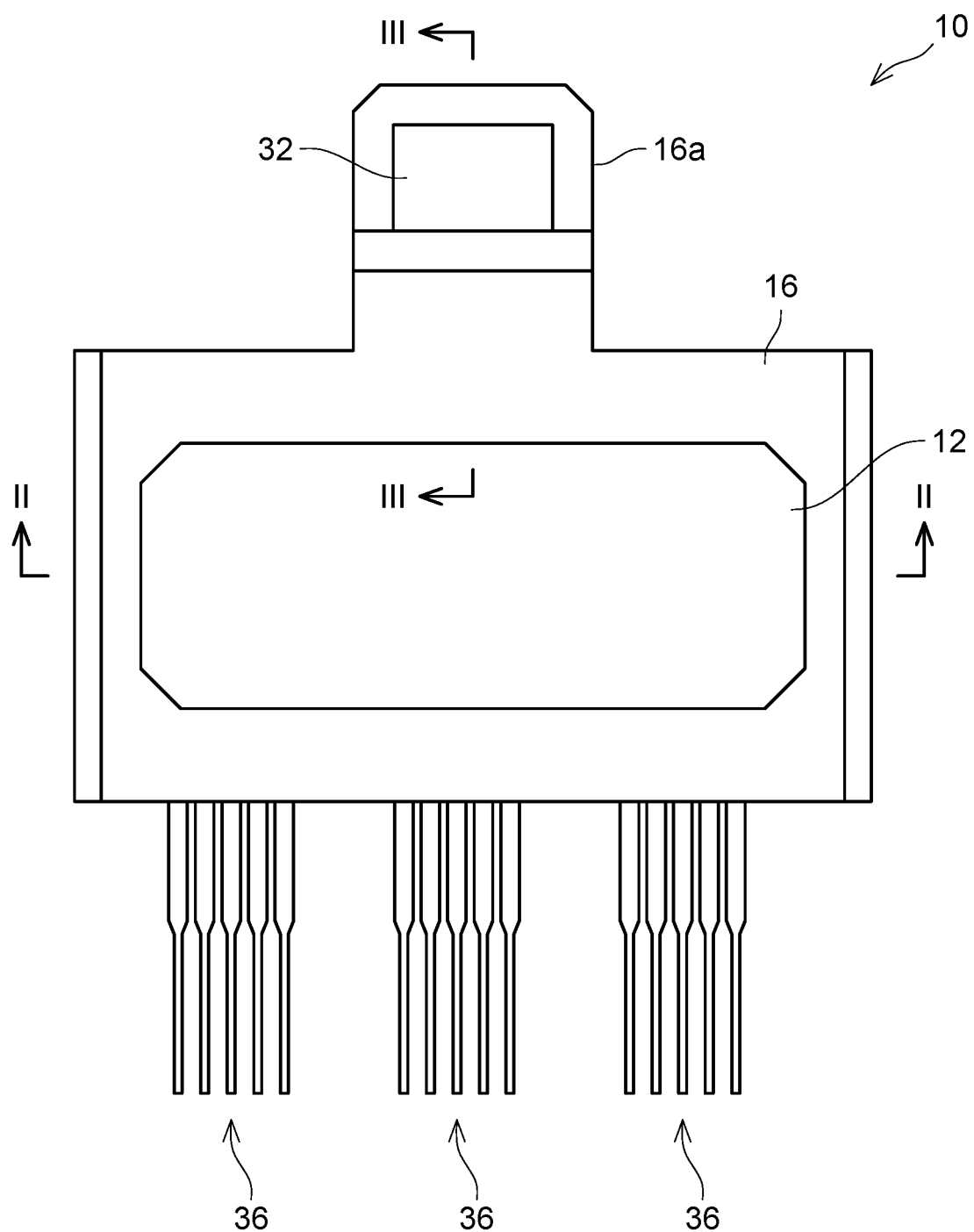
FIG. 1 is a front view illustrating an external appearance of a semiconductor device 10.
Figure 2:
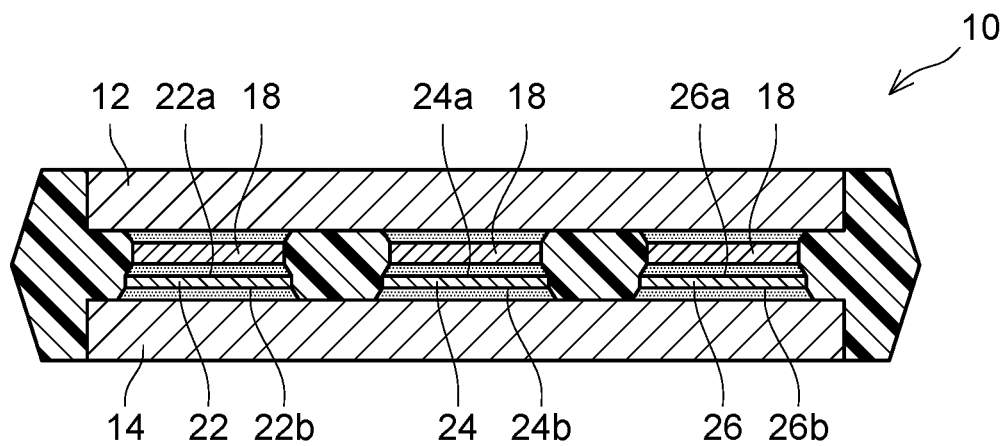
FIG. 2 is a cross-sectional view taken along a line II-II in FIG. 1, which illustrates three semiconductor chips 22, 24, and 26 encapsulated within an encapsulant 16.

According to an embodiment of the present technology, the encapsulant may comprise a protrusion extending along the first power terminal and the second power terminal. In this case, the first power terminal and the second power terminal may be at least partly opposed to each other within the protrusion. With such a configuration, insulating property between the first power terminal and the second power terminal can be maintained, and at the same time, the first power terminal and the second power terminal can be opposed to each other over a long distance. Due to this, inductances of the first power terminal and the second power terminal can be further reduced.

According to the above-described embodiment, the first power terminal and the second power terminal may be exposed along surfaces of the protrusion. With such a configuration, the first power terminal and the second power terminal can each be supported over their entireties by the protrusion of the encapsulant. Deformation of the first power terminal and the second power terminal can be suppressed, and hence connecting members such as bus bars are easily connected to the first power terminal and the second power terminal.

According to the above-described embodiment, the first power terminal and the second power terminal may be exposed from the protrusion in opposite directions to each other. With such a configuration, when connecting members such as bus bars are connected respectively to the first power terminal and the second power terminal, the protrusion is interposed between the two connecting members. Deformation of the protrusion can be suppressed, and hence these connecting members are easily connected to the first power terminal and the second power terminal.

Alternatively, the first power terminal and the second power terminal may be exposed from the protrusion in a same direction and at different positions in a longitudinal direction of the protrusion. With such a configuration, connecting members such as bus bars can be connected respectively to the first power terminal and the second power terminal from the same direction. Due to this, these connecting members are easily connected to the first power terminal and the second power terminal.

According to an embodiment of the present technology, each of the first power terminal and the second power terminal may comprise a protruding end that protrudes from the protrusion of the encapsulant. In this case, the protruding end of the first power terminal and the protruding end of the second power terminal may protrude from the protrusion of the encapsulant along a common plane. When the protruding ends that protrude from the encapsulant are located in the common plane, the encapsulant is easily formed by molding in manufacturing the semiconductor device. However, the encapsulant need not necessarily be formed by molding. Each of the first power terminal and the second power terminal may comprise a bent portion within the protrusion of the encapsulant such that the protruding ends are located in the common plane.

According to the above-described embodiment, each of the first power terminal and the second power terminal may comprise the bent portion within the protrusion of the encapsulant such that the protruding end of the first power terminal and the protruding end of the second power terminal may protrude from the protrusion of the encapsulant along the common plane. With such a configuration, deformation of the bent portions is suppressed by the encapsulant. Thus, even when external force is applied, the two protruding ends can be maintained in the common plane.

According to the above-described embodiment, the protruding end of the first power terminal and the protruding end of the second power terminal may protrude from the protrusion of the encapsulant in different directions from each other. With such a configuration, since the two protruding ends of the first power terminal and the second power terminal are arranged apart from each other, insulating property between the protruding ends can be enhanced.

Alternatively, the protruding end of the first power terminal and the protruding end of the second power terminal may protrude from the protrusion of the encapsulant in a same direction. With such a configuration, the protruding ends of the first power terminal and the second power terminal can be connected to their corresponding connecting members (such as bus bars) from the same direction.

According to an embodiment of the present technology, the at least one semiconductor chip may include a plurality of semiconductor chips. In this case, although not particularly limited, the semiconductor device may further comprise a first conductor plate electrically connected to each of the plurality of semiconductor chips within the encapsulant, and a second conductor plate opposed to the first conductor plate via the plurality of semiconductor chips and electrically connected to each of the plurality of semiconductor chips within the encapsulant. In addition, the first power terminal may be electrically connected to the first conductor plate within the encapsulant, and the second power terminal may be electrically connected to the second conductor plate within the encapsulant.

According to the above-described embodiment, at least one of the first conductor plate and the second conductor plate may comprise an opening. In this case, the opening provided in the first conductor plate may be located between the first power terminal and one of the plurality of semiconductor chips closest to the first power terminal. Due to this, currents flowing through the respective semiconductor chips can be relatively equalized. Similarly, the opening provided in the second conductor plate may be located between the second power terminal and one of the plurality of semiconductor chips closest to the second power terminal. Due to this, currents flowing through the respective semiconductor chips can be relatively equalized.

According to the above-described embodiment, the at least one of the first conductor plate and the second conductor plate may comprise a thick portion and a thin portion that is thinner than the thick portion. In this case, the plurality of semiconductor chips may be located within the thick portion, and the opening may be located within the thin portion.

In the semiconductor device according to the embodiment of the present technology, each semiconductor chip may be an Insulated Gate Bipolar Transistor (IGBT) including an emitter and a collector. In this case, the emitter(s) may be electrically connected to the first conductor plate, and the collector(s) may be electrically connected to the second conductor plate. However, according to another embodiment, each semiconductor chip may be a semiconductor chip of another type, such as a Metal-Oxide-Semiconductor Field-Effect Transistor (MOSFET) or a diode.

Representative, non-limiting examples of the present invention will now be described in further detail with reference to the attached drawings. This detailed description is merely intended to teach a person of skill in the art further details for practicing preferred aspects of the present teachings and is not intended to limit the scope of the invention. Furthermore, each of the additional features and teachings disclosed below may be utilized separately or in conjunction with other features and teachings to provide improved semiconductor devices, as well as methods for using and manufacturing the same.

Moreover, combinations of features and steps disclosed in the following detailed description may not be necessary to practice the invention in the broadest sense, and are instead taught merely to particularly describe representative examples of the invention. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

EMBODIMENTS

With reference to the drawings, a semiconductor device 10 according to an embodiment will be described. The semiconductor device 10 can be used, for example, in a power conversion circuit, such as a converter and an inverter, in an electric vehicle. The electric vehicle herein broadly means vehicles including motors that drive wheels, and includes an electric vehicle that is charged with electric power from outside, a hybrid vehicle including an engine in addition to a motor, and a fuel-cell vehicle that uses a fuel cell as its power source, for example.

As illustrated in FIG. 1 to FIG. 4, the semiconductor device 10 includes a first conductor plate 12, a second conductor plate 14, a plurality of semiconductor chips 22, 24, and 26, and an encapsulant 16. The first conductor plate 12 and the second conductor plate 14 are parallel to and opposed to each other. The plurality of semiconductor chips 22, 24, and 26 includes a first semiconductor chip 22, a second semiconductor chip 24, and a third semiconductor chip 26, although this is merely an example. The first semiconductor chip 22, the second semiconductor chip 24, and the third semiconductor chip 26 are arranged linearly along a longitudinal direction of the first conductor plate 12 and the second conductor plate 14 (a right-and-left direction in FIG. 1 and FIG. 2). The plurality of semiconductor chips 22, 24, and 26 is arranged in parallel to each other between the first conductor plate 12 and the second conductor plate 14. The plurality of semiconductor chips 22, 24, and 26 is encapsulated by the encapsulant 16.

Each of the first conductor plate 12 and the second conductor plate 14 is constituted of a conductor such as copper or another metal. The first conductor plate 12 and the second conductor plate 14 are opposed to each other with the plurality of semiconductor chips 22, 24, and 26 interposed therebetween. Each of the semiconductor chips 22, 24, and 26 is bonded not only to the first conductor plate 12 but also to the second conductor plate 14. A conductor spacer 18 is provided between the first conductor plate 12 and each of the semiconductor chips 22, 24, and 26. Specific configurations of the first conductor plate 12 and the second conductor plate 14 are not particularly limited. For example, at least one of the first conductor plate 12 and the second conductor plate 14 may he an insulating substrate including an intermediate layer of an insulator (ceramic, for example), such as a DBC (Direct Bonded Copper) substrate. In other words, an entirety of each of the first conductor plate 12 and the second conductor plate 14 need not necessarily be constituted of the conductor.

The first semiconductor chip 22, the second semiconductor chip 24, and the third semiconductor chip 26 are so-called power semiconductor chips for power circuit, and have a same configuration with each other. The first semiconductor chip 22 includes an upper electrode 22a and a lower electrode 22b. The upper electrode 22a and the lower electrode 22b are power electrodes. The upper electrode 22a is located on an upper surface of the first semiconductor chip 22, and the lower electrode 22b is located on a lower surface of the first semiconductor chip 22. The upper electrode 22a is electrically connected to the first conductor plate 12 via the conductor spacer 18, and the lower electrode 22b is electrically connected to the second conductor plate 14.

Similarly, the second semiconductor chip 24 includes an upper electrode 24a and a lower electrode 24b, and the third semiconductor chip 26 includes an upper electrode 26a and a lower electrode 26b. The upper electrodes 24a and 26a are electrically connected to the first conductor plate 12 via their corresponding conductor spacers 18, and the lower electrodes 24b and 26b are electrically connected to the second conductor plate 14.

Each of the semiconductor chips 22, 24, and 26 according to this embodiment includes an IGBT structure including an emitter and a collector, although this is merely an example. The emitters of the IGBT structures are respectively connected to their corresponding upper electrodes 22a, 24a, and 26a, and the collectors of the IGBT structures are respectively connected to their corresponding lower electrodes 22b, 24b, and 26b. However, specific types and structures of the semiconductor chips 22, 24, and 26 are not particularly limited. Each of the semiconductor chips 22, 24, and 26 may be an RC (Reverse Conducting)-IGBT chip further including a diode structure. Alternatively, each of the semiconductor chips 22, 24, and 26 may include, for example, a MOSFET structure instead of or in addition to the IGBT structure. In addition, semiconductor materials to be used for the semiconductor chips 22, 24, and 26 are also not particularly limited, and nitride semiconductors such as silicon (Si), silicon carbide (SiC), and gallium nitride (GaN) may be employed.

Although not particularly limited, the encapsulant 16 may be constituted of thermosetting resin such as epoxy resin, or another insulator. The encapsulant 16 is referred to also as, for example, a molded resin or a package. The semiconductor device 10 need not necessarily to include the three semiconductor chips 22, 24, and 26, and the semiconductor device 10 only has to include at least one semiconductor chip.

The first conductor plate 12 and the second conductor plate 14 are connected to the plurality of semiconductor chips 22, 24, and 26 not only electrically but also thermally. Further, the first conductor plate 12 and the second conductor plate 14 are respectively exposed on surfaces of the encapsulant 16, and thus can dissipate heat of the semiconductor chips 22, 24, and 26 to outside of the encapsulant 16. As such, the semiconductor device 10 according to this embodiment includes a double-sided cooling structure in which heat dissipating plates are arranged on both sides of the semiconductor chips 22, 24, and 26.

Figure 3:
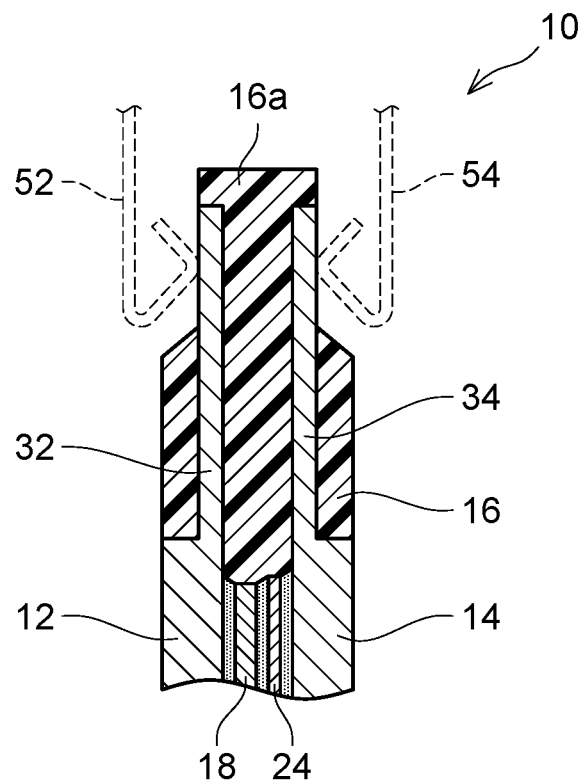
FIG. 3 is a cross-sectional view taken along a line III-III in FIG. 1, which illustrates a first power terminal 32 and a second power terminal 34 opposed to each other within the encapsulant 16.
Figure 4:
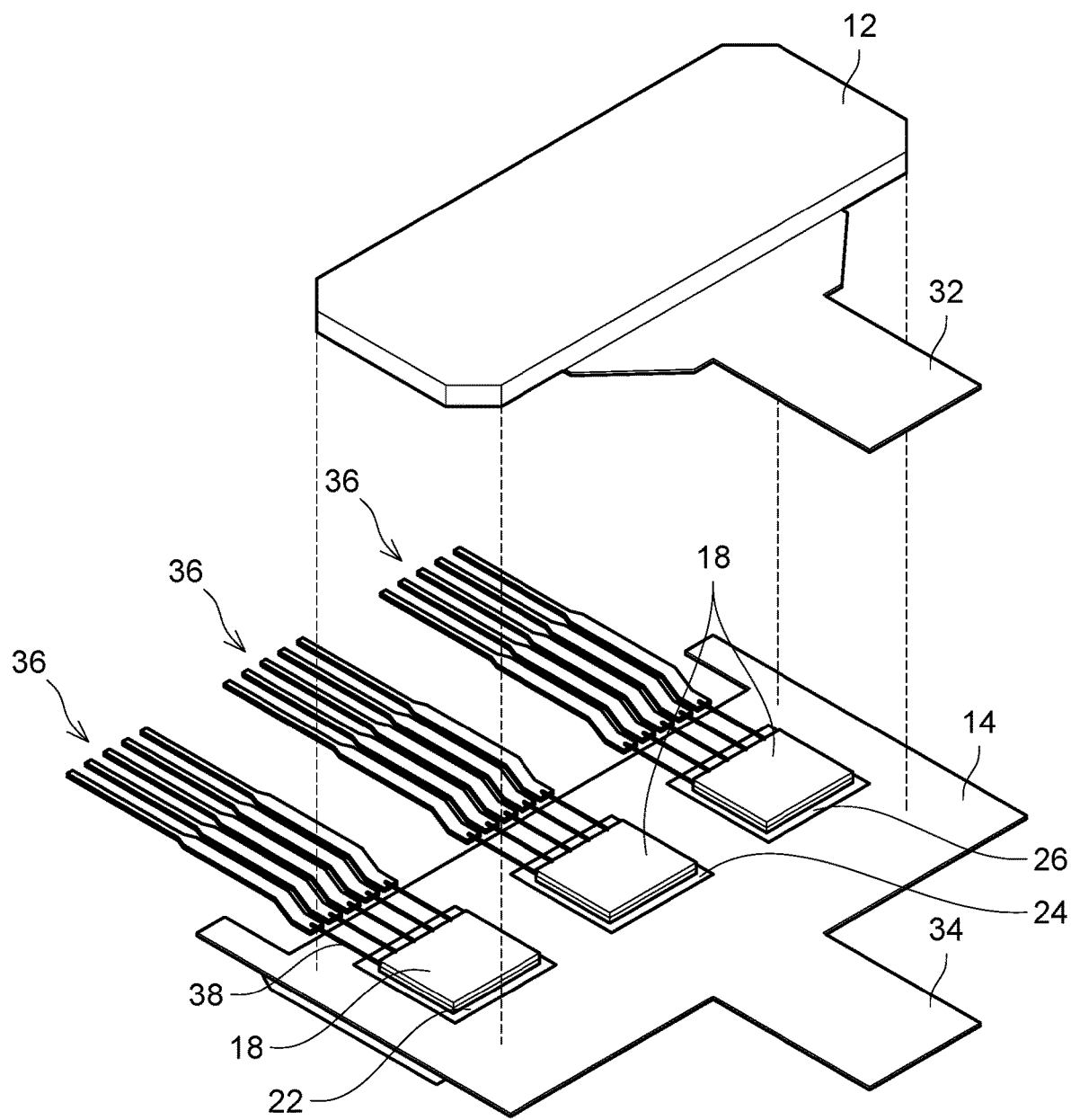
FIG. 4 is an exploded view illustrating an internal structure of the semiconductor device 10, from which the encapsulant 16 is omitted.

As understood from FIG. 4, in the semiconductor device 10 according to this embodiment, the second conductor plate 14 is larger than the first conductor plate 12. Specifically, the first conductor plate 12 has its four corners chamfered, but such processing is not applied to the second conductor plate 14. This is because the first conductor plate 12 and the second conductor plate 14 are positioned to each other with a common jig in manufacturing of the semiconductor device 10. When the second conductor plate 14 is larger than the first conductor plate 12, the first conductor plate 12 can be supported by the jig from below, and at the same time, the second conductor plate 14 also can be supported by a plurality of support posts extending upward from the jig, The semiconductor device 10 further includes a first power terminal 32, a second power terminal 34, and a plurality of signal terminals 36. Each of the terminals 32, 34, and 36 is constituted of a conductor such as copper or aluminum, and extends from inside to the outside of the encapsulant 16. Within the encapsulant 16, the first power terminal 32 is connected to the first conductor plate 12. Within the encapsulant 16, the second power terminal 34 is connected to the second conductor plate 14. Due to this, the semiconductor chips 22, 24, and 26 are connected electrically in parallel to each other between the first power terminal 32 and the second power terminal 34. Further, both the first power terminal 32 and the second power terminal 34 are exposed to the outside of the encapsulant 16, and external connecting members 52 and 54, such as bus bars, are respectively connected thereto (see FIG. 3). Each of the signal terminals 36 is connected to corresponding one of signal pads (not shown) of the semiconductor chips 22, 24, and 26 via a bonding wire 38.

As an example, the first power terminal 32 is soldered to the first conductor plate 12, and the second power terminal 34 is configured integrally with the second conductor plate 14. The first power terminal 32 may be configured integrally with the first conductor plate 12. Further, the second power terminal 34 may, for example, be soldered to the second conductor plate 14. In addition, each of the signal terminals 36 may be connected directly to the corresponding one of the signal pads, without the bonding wire 38.

As illustrated in FIG. 3, the first power terminal 32 and the second power terminal 34 each have a plate shape, and are opposed to each other within the encapsulant 16. In other words, the first power terminal 32 and the second power terminal 34 are opposed to each other in their thickness directions, and their main surfaces (surfaces that expand perpendicularly to their thickness directions) are opposed to each other via a part of the encapsulant 16. With such a configuration, insulating property between the first power terminal 32 and the second power terminal 34 can be maintained, and at the same time, inductances of the first power terminal 32 and the second power terminal 34 can be reduced. In other words, since the first power terminal 32 and the second power terminal 34 are connected to each other via the plurality of semiconductor chips 22, 24, and 26, currents in opposite directions to each other flow respectively through the first power terminal 32 and the second power terminal 34. At this time, since the first power terminal 32 and the second power terminal 34 are opposed to each other, a magnetic field that is generated by the current through the first power terminal 32 and a magnetic field that is generated by the current through the second power terminal 34 cancel out each other. Due to this, the magnetic fields that are generated around the first power terminal 32 and the second power terminal 34 are suppressed, and hence the inductances of the first power terminal 32 and the second power terminal 34 are significantly reduced. When the inductances of the first power terminal 32 and the second power terminal 34 are reduced, surge voltage at times when the semiconductor chips 22, 24, and 26 are switched is suppressed, for example.

In the semiconductor device 10 according to this embodiment, the encapsulant 16 includes a protrusion 16a extending along the first power terminal 32 and the second power terminal 34. The first power terminal 32 and the second power terminal 34 are opposed to each other within the protrusion 16a (see FIG. 3). With such a configuration, the insulating property between the first power terminal 32 and the second power terminal 34 can be maintained, and at the same time, the first power terminal 32 and the second power terminal 34 can be opposed to each other over a long distance. Due to this, the inductances of the first power terminal 32 and the second power terminal 34 can be further reduced. Further, the first power terminal 32 and the second power terminal 34 do not protrude from the encapsulant 16, and hence the encapsulant 16 can be easily formed by molding in manufacturing the semiconductor device 10. In other words, in forming the encapsulant 16 by molding, entireties of the first power terminal 32 and the second power terminal 34 can be accommodated within a mold.

In the semiconductor device 10 according to this embodiment, the first power terminal 32 and the second power terminal 34 are exposed respectively along surfaces of the protrusion 16a of the encapsulant 16 (see FIG. 3). With such a configuration, the first power terminal 32 and the second power terminal 34 can be supported by the protrusion 16a of the encapsulant 16 over their entireties. Deformation of the first power terminal 32 and the second power terminal 34 can be suppressed, and hence the connecting members 52 and 54 such as bus bars are easily connected to the first power terminal 32 and the second power terminal 34.

In the semiconductor device 10 according to this embodiment, the first power terminal 32 and the second power terminal 34 are exposed from the protrusion 16a of the encapsulant 16 in opposite directions to each other. With such a configuration, when the connecting members 52 and 54 such as bus bars are connected respectively to the first power terminal 32 and the second power terminal 34, the protrusion 16a is interposed between the two connecting members 52 and 54. Deformation of the protrusion 16a can be suppressed, and hence these connecting members 52 and 54 are easily connected to the first power terminal 32 and the second power terminal 34. For example, by inserting the protrusion 16a of the encapsulant 16 between the two connecting members 52 and 54, connection of these two connecting members 52 and 54 to the first power terminal 32 and the second power terminal 34 can be easily performed. At this time, if the plurality of signal terminals 36 protrudes in a same direction as the direction in which the first power terminal 32 and the second power terminal 34 protrude, the signal terminals 36 can be connected to their corresponding connecting members (such as connectors) at the same time.

In the semiconductor device 10 according to this embodiment, the first power terminal 32 and the second power terminal 34 are opposed to each other entirely. However, the first power terminal 32 and the second power terminal 34 only have to be at least partly opposed to each other in their thickness directions. In this case, the first power terminal 32 and the second power terminal 34 may be offset to each other, may have different width dimensions from each other, or may have different longitudinal dimensions from each other.

Figure 5:
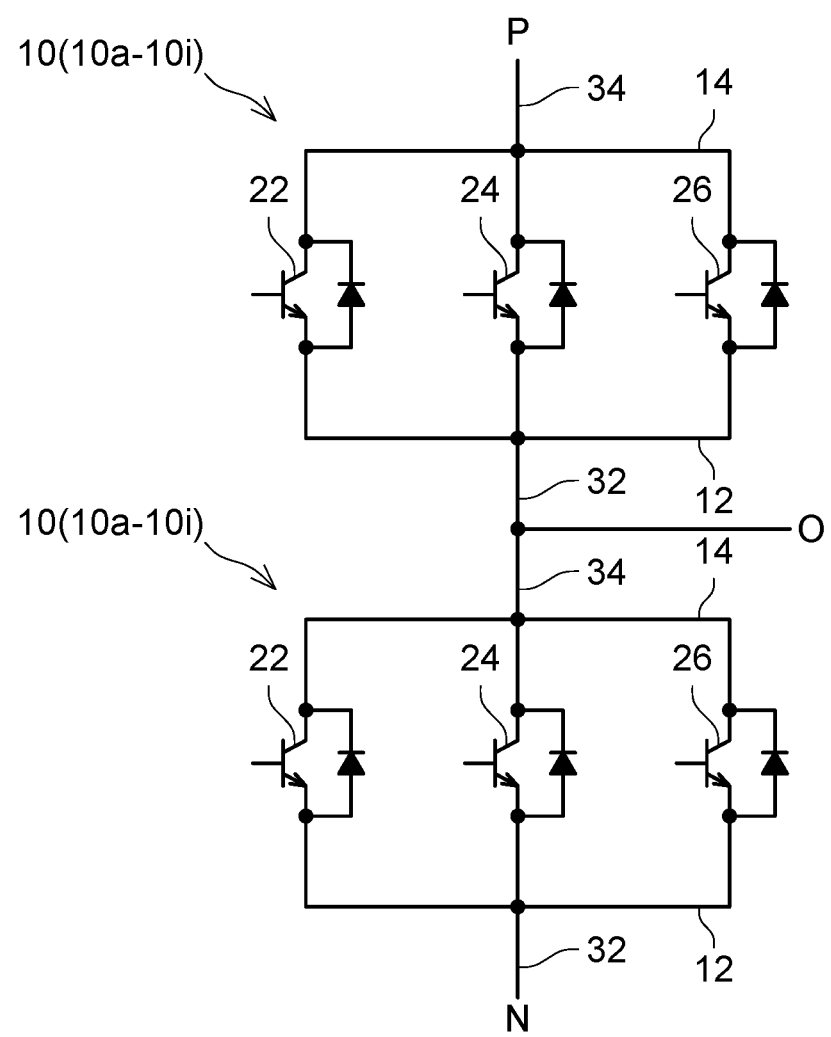
FIG. 5 is a diagram showing a circuit configuration in which the two semiconductor devices 10 are connected in series.

As described above, the semiconductor device 10 disclosed herein may be used, for example, in a power conversion circuit such as a converter or an inverter. In this case, as shown in FIG. 5, by connecting the two semiconductor devices 10 in series, an upper arm and a lower arm of the converter or the inverter can be configured. In this case, the three semiconductor chips 22, 24, and 26 of one of the semiconductor devices 10 are connected in parallel to each other in the upper arm, and the three semiconductor chips 22, 24, and 26 of the other one of the semiconductor devices 10 are connected in parallel to each other in the lower arm. Each of the semiconductor devices 10 in the circuit shown in FIG. 5 may be replaced with semiconductor devices 10a-10i according to variants to be described below.

Figure 6:
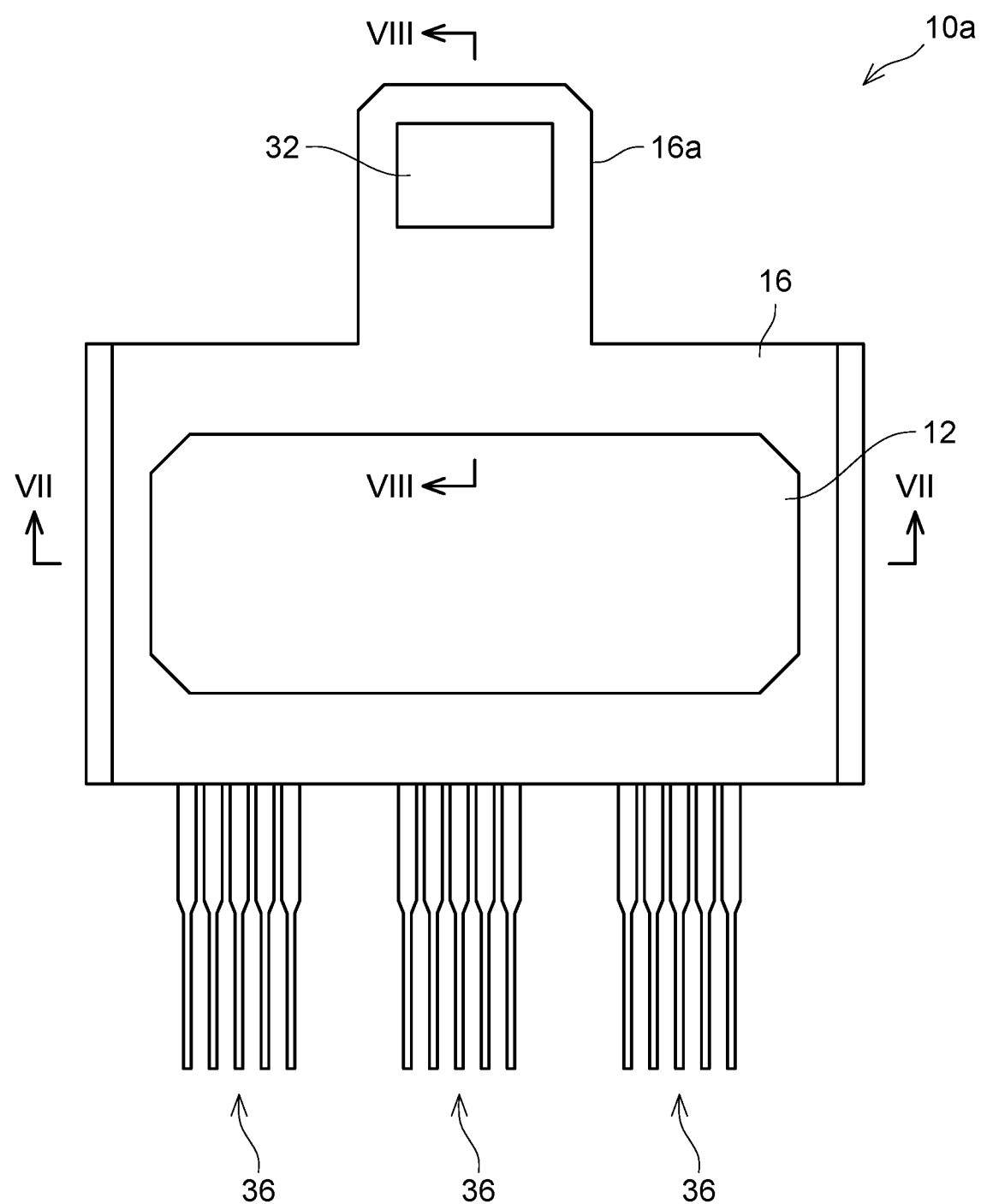
FIG. 6 is a front view illustrating an external appearance of a semiconductor device 10a according to a variant.
Figure 7:
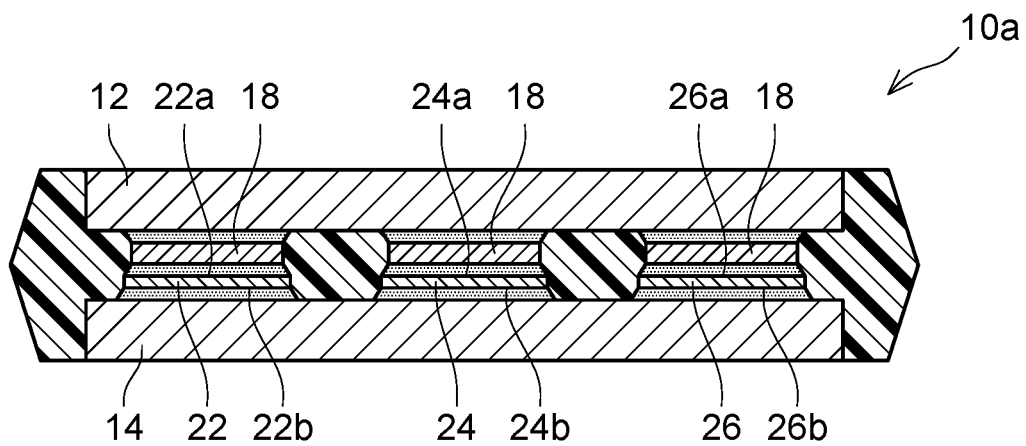
FIG. 7 is a cross-sectional view taken along a line in FIG. 6, which illustrates the three semiconductor chips 22, 24, and 26 encapsulated within the encapsulant 16.
Figure 8:
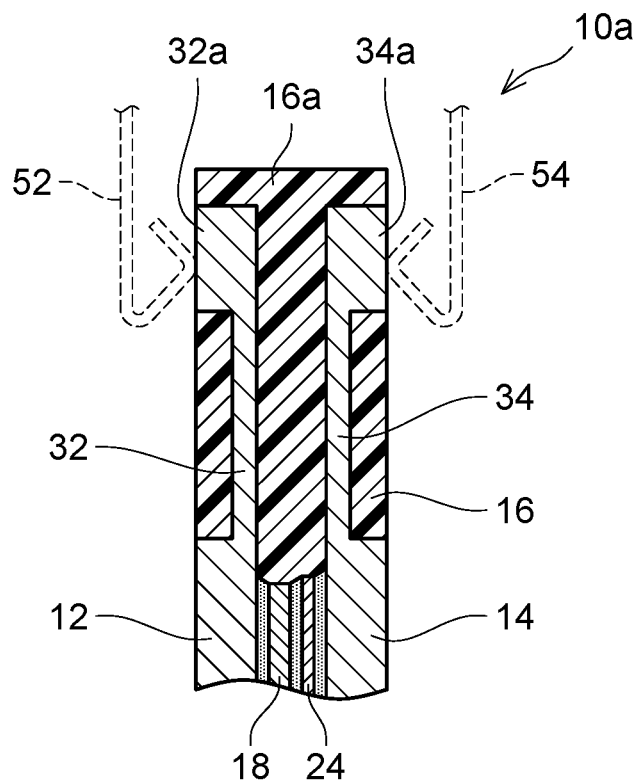
FIG. 8 is a cross-sectional view taken along a line VIII-VIII in FIG. 6, which illustrates the first power terminal 32 and the second power terminal 34 opposed to each other within the encapsulant 16.

Next, with reference to FIG. 6 to FIG. 8, a semiconductor device 10a according to a variant will be described. As illustrated in FIG. 6 to FIG. 8, the semiconductor device 10a according to this variant is different from the semiconductor device 10 illustrated in FIG. 1 to FIG. 4 in the structure that exposes the first power terminal 32 and the second power terminal 34. Other structures thereof are common to those of the semiconductor device 10 illustrated in FIG. 1 to FIG. 4, and hence the same reference signs are given thereto and descriptions thereof will be omitted.

As illustrated in FIG. 8, in the semiconductor device 10a according to this variant, the first power terminal 32 includes a thick portion 32a, and this thick portion 32a is exposed to the outside at the protrusion 16a of the encapsulant 16. Similarly, the second power terminal 34 includes a thick portion 34a, and this thick portion 34a is exposed to the outside at the protrusion 16a of the encapsulant 16. With such a configuration, the protrusion 16a of the encapsulant 16 can be formed to have a uniform thickness, and hence a strength of the protrusion 16a can be increased.

Figure 9:
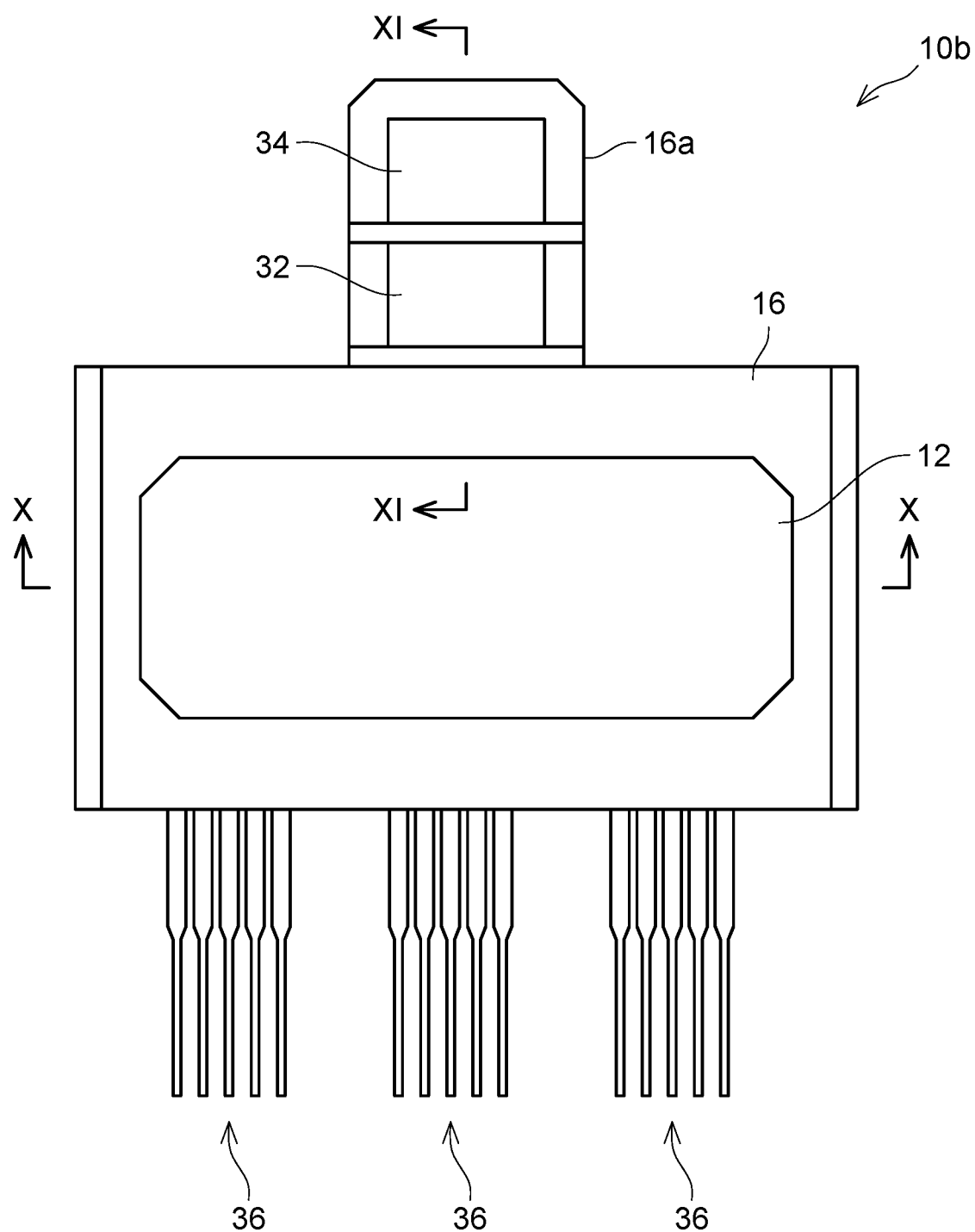
FIG. 9 is a front view illustrating an external appearance of a semiconductor device 10b according to another variant.
Figure 10:
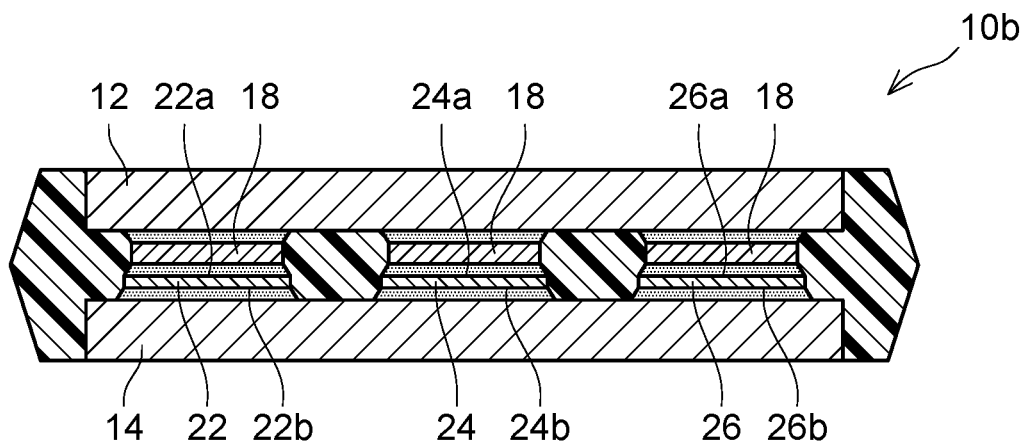
FIG. 10 is a cross-sectional view taken along a line X-X in FIG. 9, which illustrates the three semiconductor chips 22, 24, and 26 encapsulated within the encapsulant 16.
Figure 11:
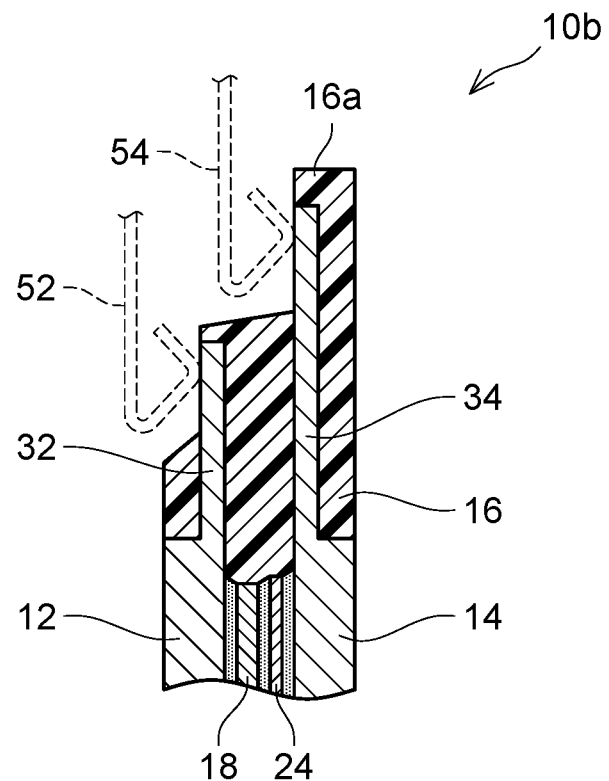
FIG. 11 is a cross-sectional view taken along a line XI-XI in FIG. 9, which illustrates the first power terminal 32 and the second power terminal 34 opposed to each other within the encapsulant 16.

Next, with reference to FIG. 9 to FIG. 11, a semiconductor device 10b according to another variant will be described. As illustrated in FIG. 9 to FIG. 11, the semiconductor device 10b according to this variant is different from the semiconductor device 10 illustrated in FIG. 1 to FIG. 4 in the structure that exposes the first power terminal 32 and the second power terminal 34. Other structures thereof are common to those of the semiconductor device 10 illustrated in FIG. 1 to FIG. 4, and hence the same reference signs are given thereto and descriptions thereof will be omitted.

As illustrated in FIG. 11, in the semiconductor device 10b according to this variant, the first power terminal 32 and the second power terminal 34 are exposed from the protrusion 16a in a same direction and at different positions in a longitudinal direction of the protrusion 16a. With such a configuration, the connecting members 52 and 54 such as bus bars can be connected respectively to the first power terminal 32 and the second power terminal 34 from a same direction. Due to this, these connecting members 52 and 54 are easily connected to the first power terminal 32 and the second power terminal 34.

Figure 12:
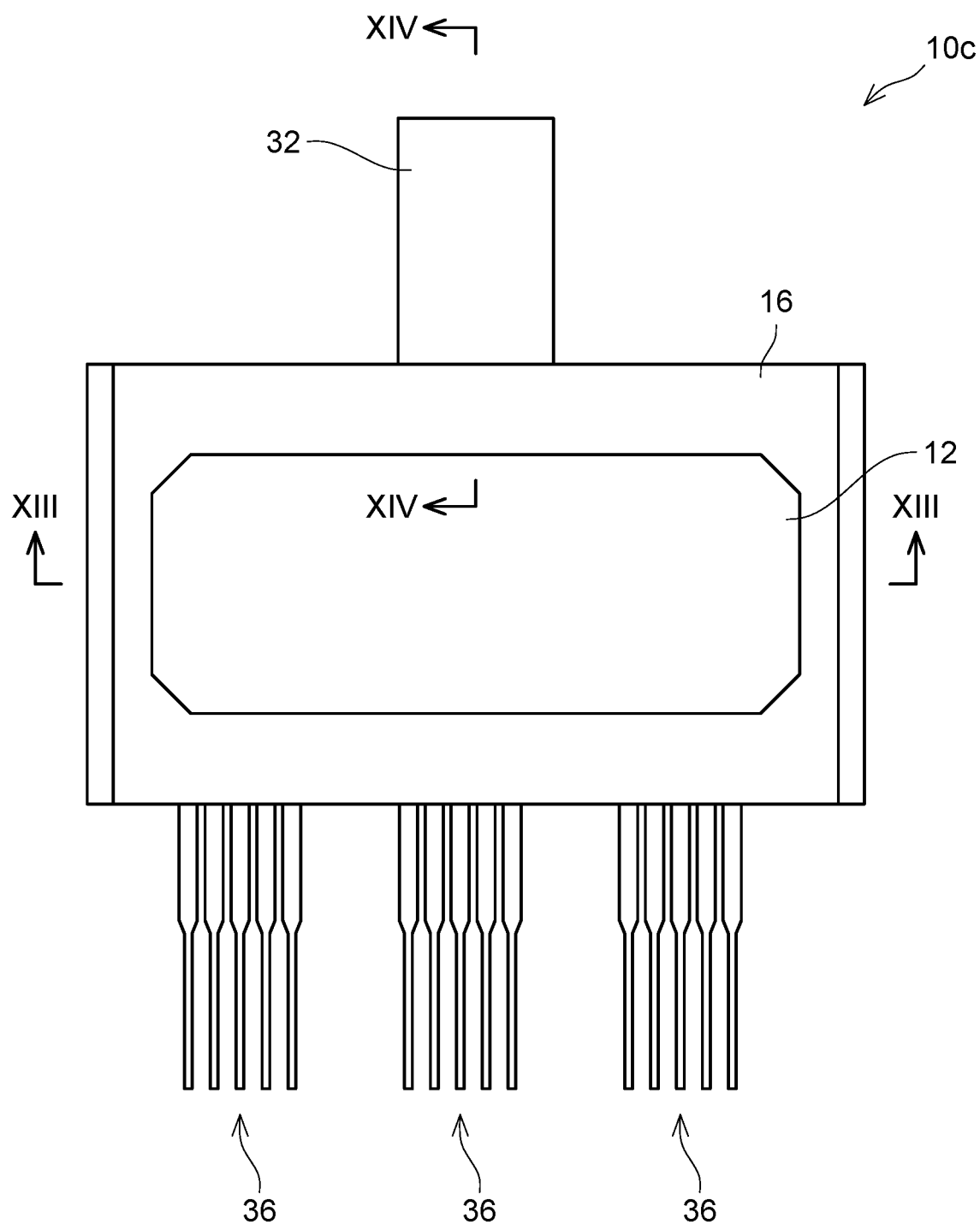
FIG. 12 is a front view illustrating an external appearance of a semiconductor device 10c according to still another variant.
Figure 13:
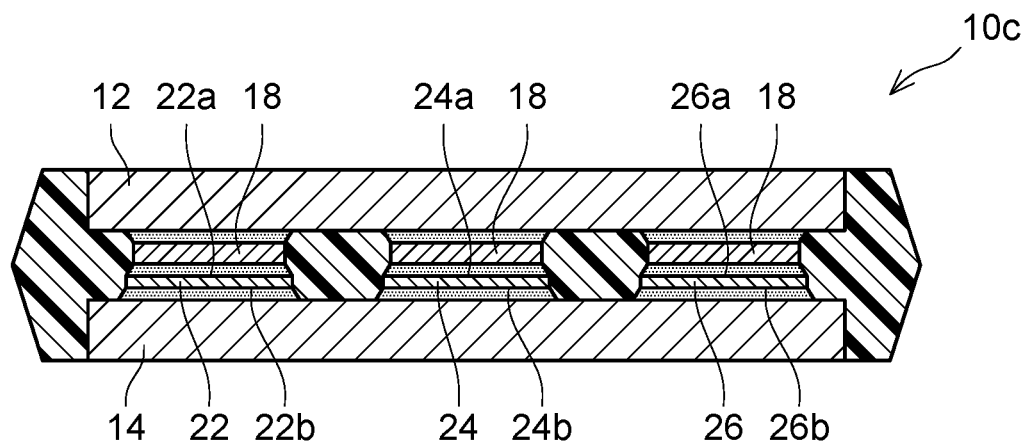
FIG. 13 is a cross-sectional view taken along a line XIII-XIII in FIG. 12, which illustrates the three semiconductor chips 22, 24, and 26 encapsulated within the encapsulant 16.
Figure 14:
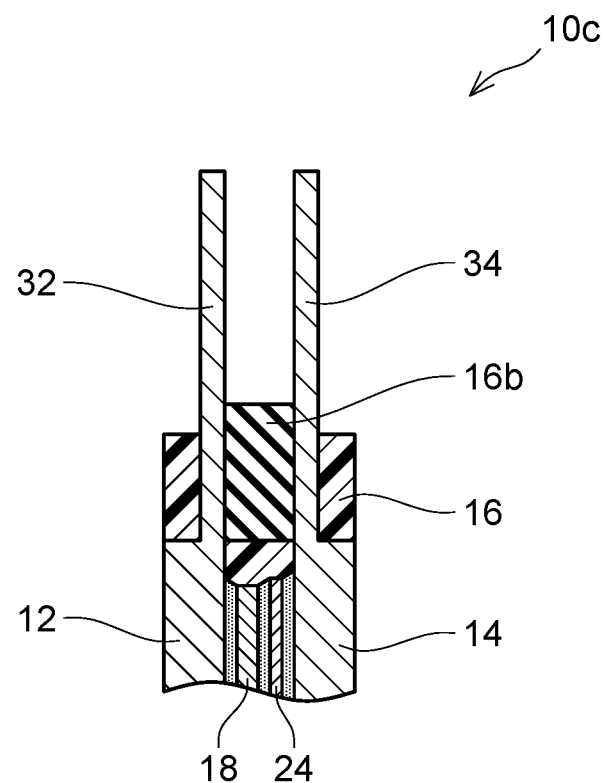
FIG. 14 is a cross-sectional view taken along a line XIV-XIV in FIG. 12, which illustrates the first power terminal 32 and the second power terminal 34 opposed to each other within the encapsulant 16.

Next, with reference to FIG. 12 to FIG. 14, a semiconductor device 10c according to still another variant will be described. As illustrated in FIG. 12 to FIG. 14, the semiconductor device 10c according to this variant is different from the semiconductor device 10 illustrated in FIG. 1 to FIG. 4 in the structure that exposes the first power terminal 32 and the second power terminal 34. Other structures thereof are common to those of the semiconductor device 10 illustrated in FIG. 1 to FIG. 4, and hence the same reference signs are given thereto and descriptions thereof will be omitted.

As illustrated in FIG. 14, in the semiconductor device 10c according to this variant, the first power terminal 32 and the second power terminal 34 protrude from the encapsulant 16 while being opposed to each other. With a configuration where the two power terminals 32 and 34 protrude parallel to each other from the encapsulant 16, it is difficult to form the encapsulant 16 by molding in manufacturing the semiconductor device 10. This is because an upper mold and a lower mold of the mold cannot be fully closed, and a gap is thereby formed between the first power terminal 32 and the second power terminal 34. In view of this, the encapsulant 16 of the semiconductor device 10c according to this variant is formed by molding under a state where an insulator 16b is interposed between the first power terminal 32 and the second power terminal 34. This insulator 16b becomes integral with the encapsulant 16 after the molding, and constitutes a part of the encapsulant 16. With such a configuration, the protrusion 16a need not necessarily be provided with the protrusion 16a.

Figure 15:
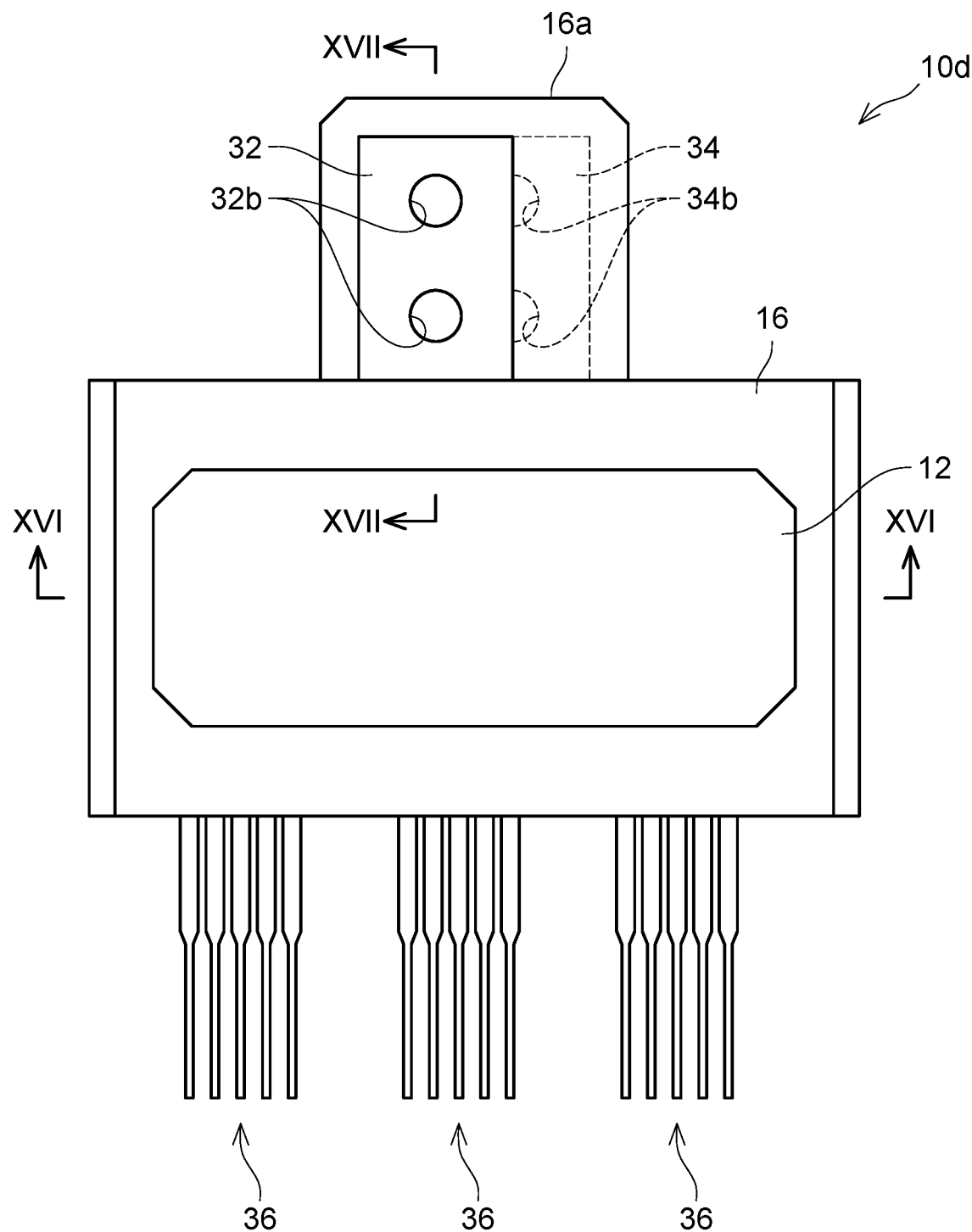
FIG. 15 is a front view illustrating an external appearance of a semiconductor device 10d according to yet another variant.
Figure 16:
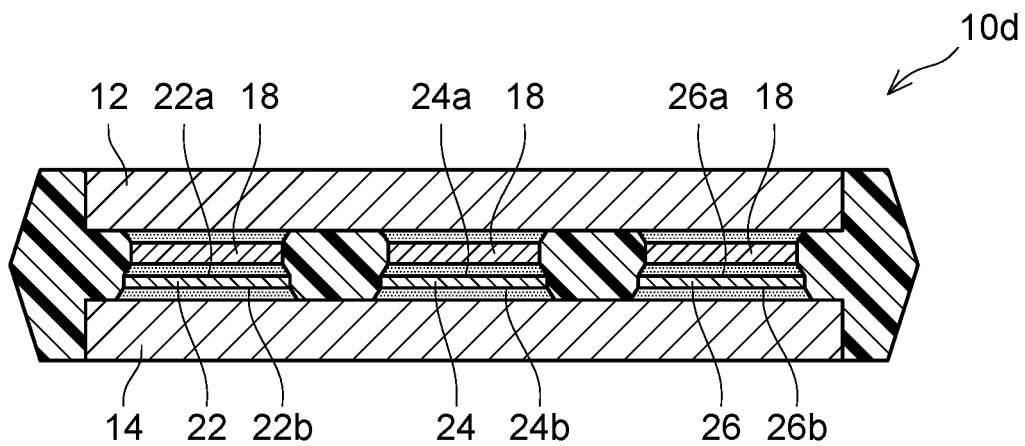
FIG. 16 is a cross-sectional view taken along a line XVI-XVI in FIG. 15, which illustrates the three semiconductor chips 22, 24, and 26 encapsulated within the encapsulant 16.
Figure 17:
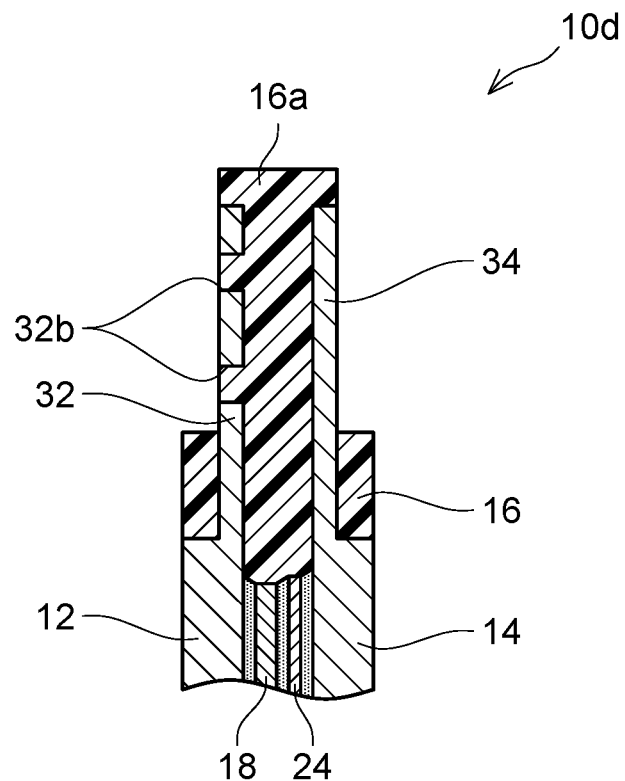
FIG. 17 is a cross-sectional view taken along a line XVII-XVII in FIG. 15, which illustrates the first power terminal 32 and the second power terminal 34 opposed to each other within the encapsulant 16.

Next, with reference to FIG. 15 to FIG. 17, a semiconductor device 10d according to yet another variant will be described. As illustrated in FIG. 15 to FIG. 17, the semiconductor device 10d according to this variant is different from the semiconductor device 10 illustrated in FIG. 1 to FIG. 4 in the structure that exposes the first power terminal 32 and the second power terminal 34. Other structures thereof are common to those of the semiconductor device 10 illustrated in FIG. 1 to FIG. 4, and hence the same reference signs are given thereto and descriptions thereof will be omitted.

As illustrated in FIG. 15 and FIG. 17, in the semiconductor device 10d according to this variant, through holes 32b are provided in the first power terminal 32, and through holes 34b are provided in the second power terminal 34. Each of the through holes 32b and 34b is filled with the material of the encapsulant 16. The first power terminal 32 and the second power terminal 34 are offset to each other in a lateral direction such that the through holes 32b and the through holes 34b do not overlap with each other. With such a configuration, in forming the encapsulant 16 by molding, the second power terminal 34 can be pressed onto an inner surface of the mold by a jig (such as support posts) inserted through the through holes 32b of the first power terminal 32. Similarly, the first power terminal 32 can be pressed onto another inner surface of the mold with a jig (such as support posts) inserted through the through holes 34b of the second power terminal 34. Due to this, in forming the encapsulant 16 by molding, deformation of the first power terminal 32 and the second power terminal 34 can be suppressed, and at the same time, the first power terminal 32 and the second power terminal 34 can be exposed on the surfaces of the encapsulant 16, respectively. If the first power terminal 32 and the second power terminal 34 have already been exposed when the encapsulant 16 is formed, machining on the encapsulant 16 to be performed thereafter can be omitted.

Figure 18:
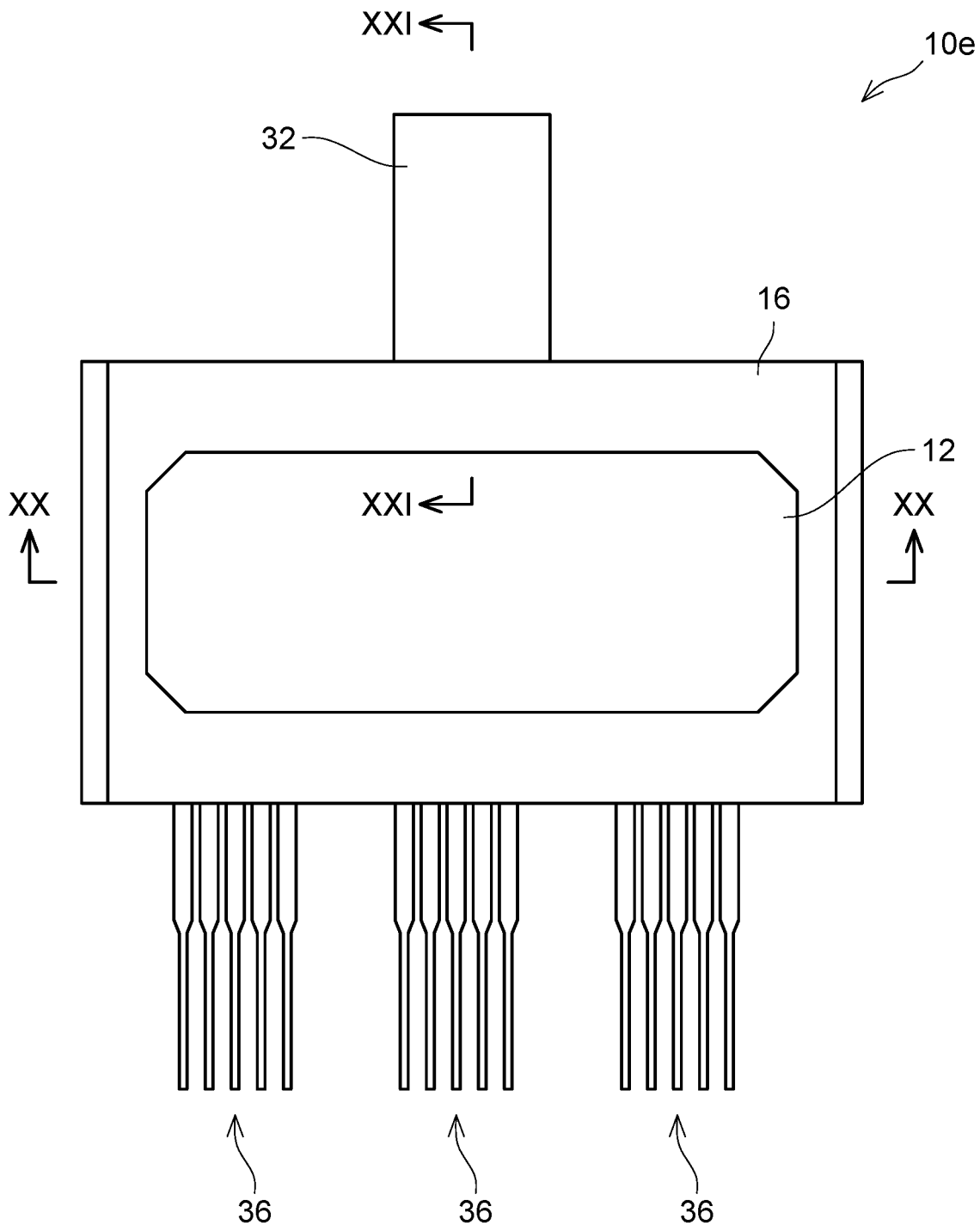
FIG. 18 is a front view illustrating an external appearance of a semiconductor device 10e according to yet another variant.

Next, with reference to FIG. 18 to FIG. 21, a semiconductor device 10e according to yet another variant will be described. As illustrated in FIG. 18 to FIG, 21, the semiconductor device 10e according to this variant is different from the semiconductor device 10 illustrated in FIG. 1 to FIG. 4 in the structure that exposes the first power terminal 32 and the second power terminal 34. Other structures thereof are common to those of the semiconductor device 10 illustrated in FIG. 1 to FIG. 4, and hence the same reference signs are given thereto and descriptions thereof will be omitted.

Figure 19:
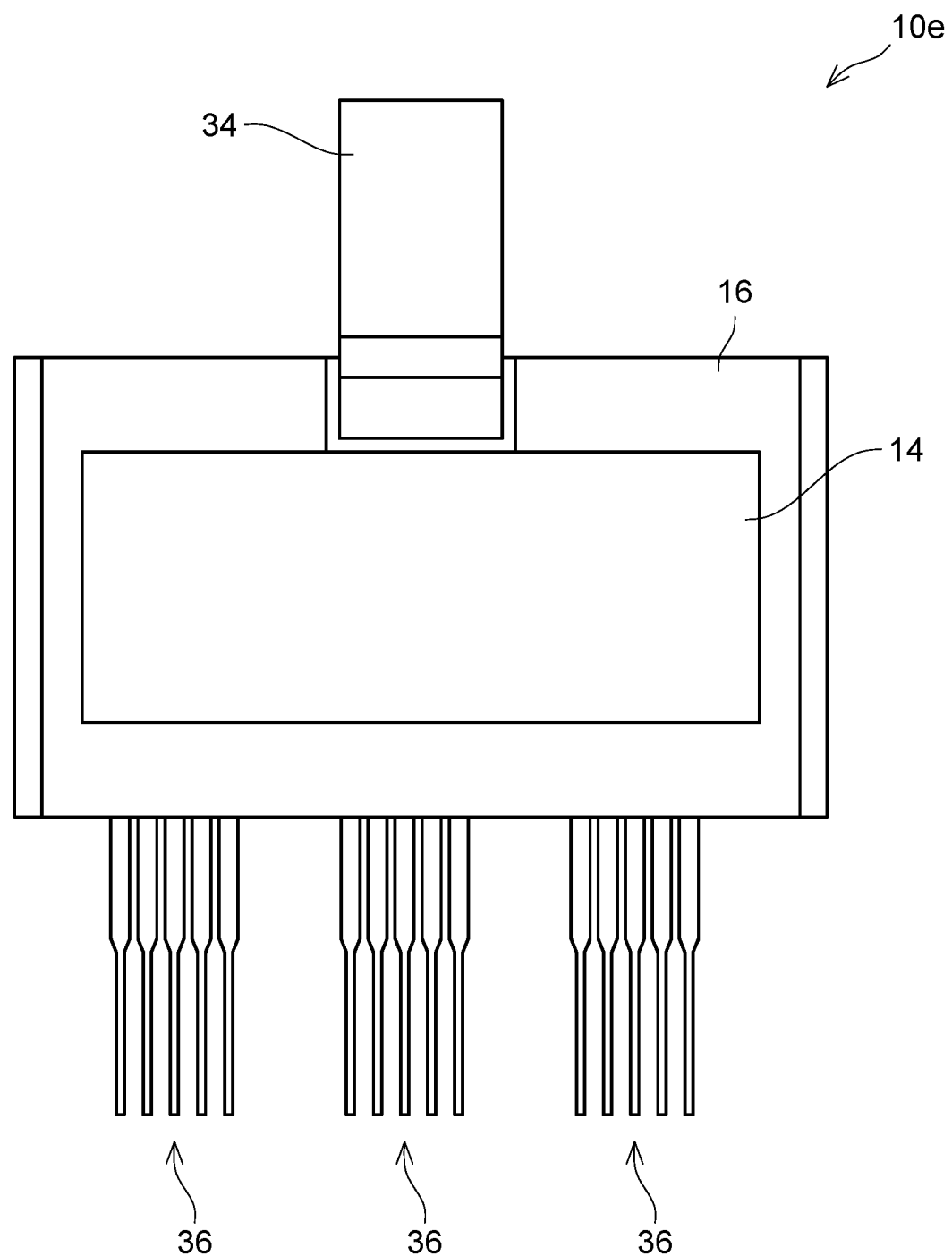
FIG. 19 is a rear view illustrating the external appearance of the semiconductor device 10e according to the yet another variant.
Figure 20:
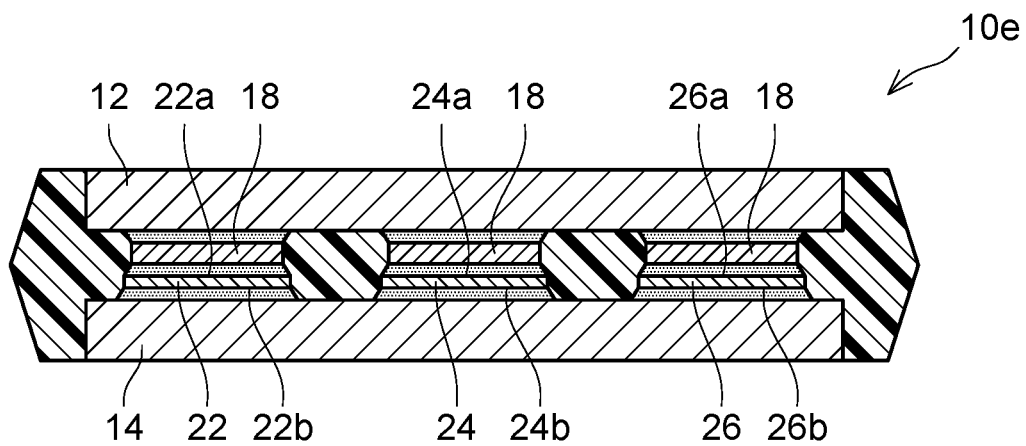
FIG. 20 is a cross-sectional view taken along a line XX-XX in FIG. 18, which illustrates the three semiconductor chips 22, 24 and 26 encapsulated within the encapsulant 16.
Figure 21:
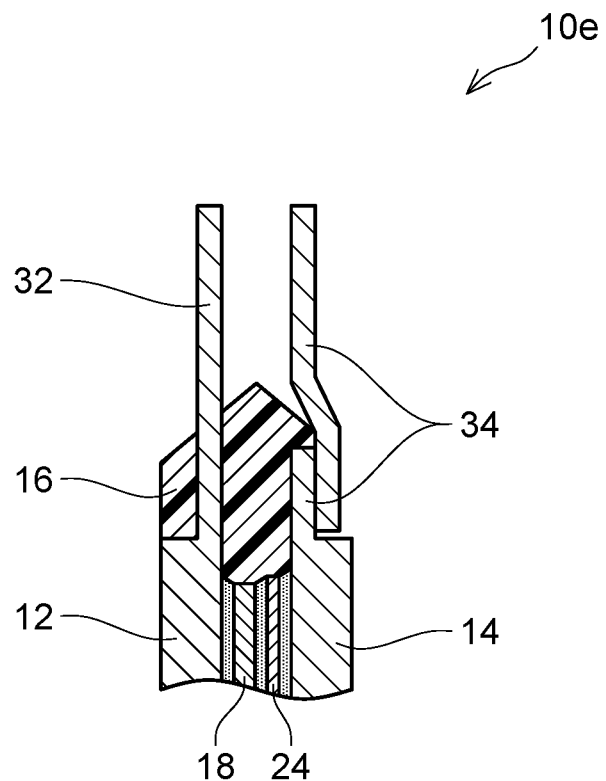
FIG. 21 is a cross-sectional view taken along a line XXI-XXI in FIG. 18, which illustrates the first power terminal 32 and the second power terminal 34 opposed to each other within the encapsulant 16.

As illustrated in FIG. 19 and FIG. 21, in the semiconductor device 10e according to this variant, a part of the second power terminal 34 is configured integrally with the second conductor plate 14, and is opposed to the first power terminal 32 within the encapsulant 16. In addition, on the outside of the encapsulant 16, another part of the second power terminal 34 is bonded to the part of the second power terminal 34 located within the encapsulant 16. With such a configuration, when the encapsulant 16 is formed, only the first power terminal 32 protrudes from the encapsulant 16. Thus, the encapsulant 16 can be easily formed by molding.

Next, with reference to FIG. 22 to FIG. 25, a semiconductor device 10f according to yet another variant will be described. As illustrated in FIG. 22 to FIG. 25, the semiconductor device 10f according to this variant is different from the semiconductor device 10 illustrated in FIG. 1 to FIG. 4 in the structure that exposes the first power terminal 32 and the second power terminal 34. Other structures thereof are common to those of the semiconductor device 10 illustrated in FIG. 1 to FIG. 4, and hence the same reference signs are given thereto and descriptions thereof will he omitted.

Figure 22:
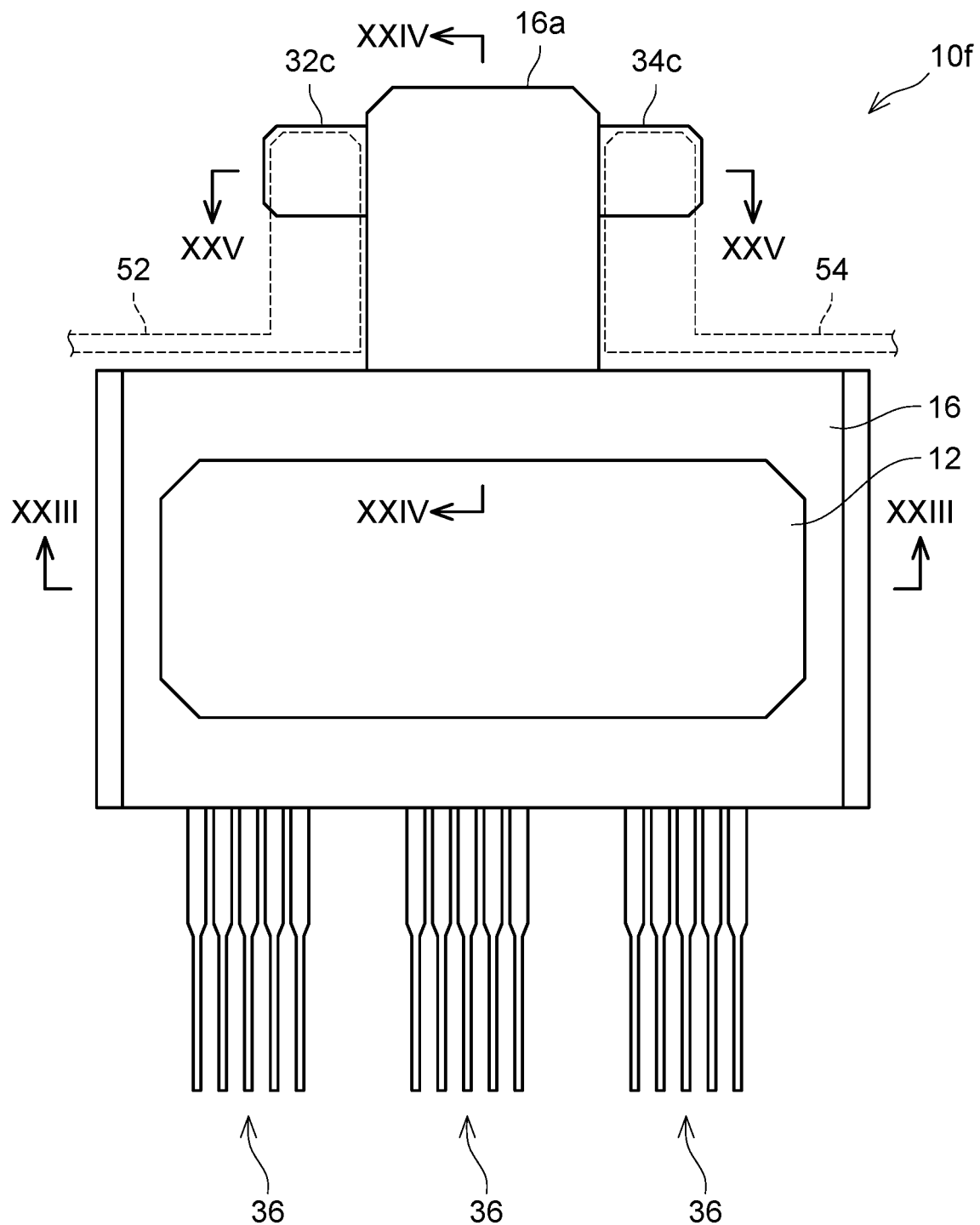
FIG. 22 is a front view illustrating an external appearance of a semiconductor device 10f according to yet another variant.
Figure 23:
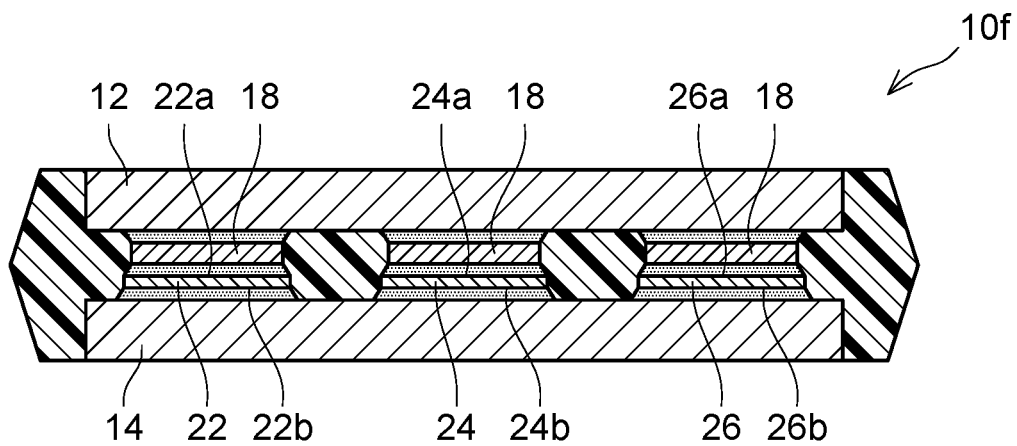
FIG. 23 is a cross-sectional view taken along a line XXIII-XXIII in FIG. 22, which illustrates the three semiconductor chips 22, 24, and 26 encapsulated within the encapsulant 16.
Figure 24:
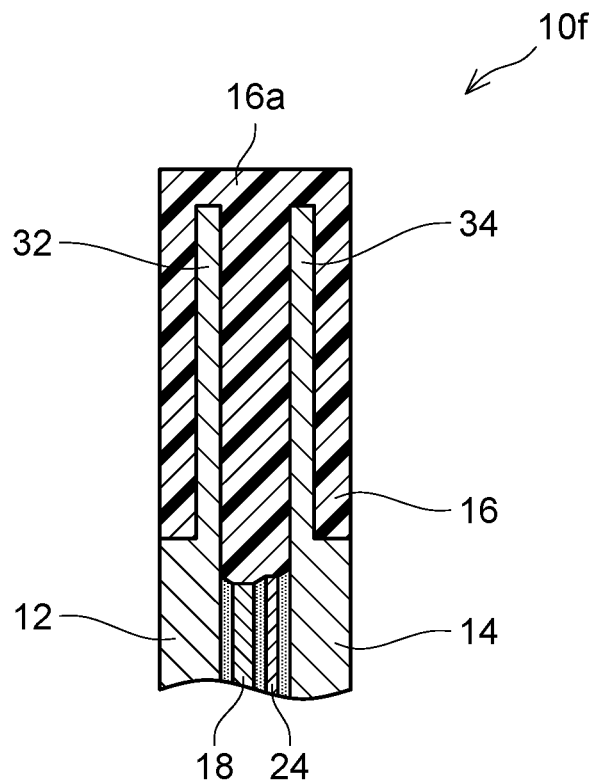
FIG. 24 is a cross-sectional view taken along a line XXIV-XXIV in FIG. 22, which illustrates the first power terminal 32 and the second power terminal 34 opposed to each other within the encapsulant 16.
Figure 25:
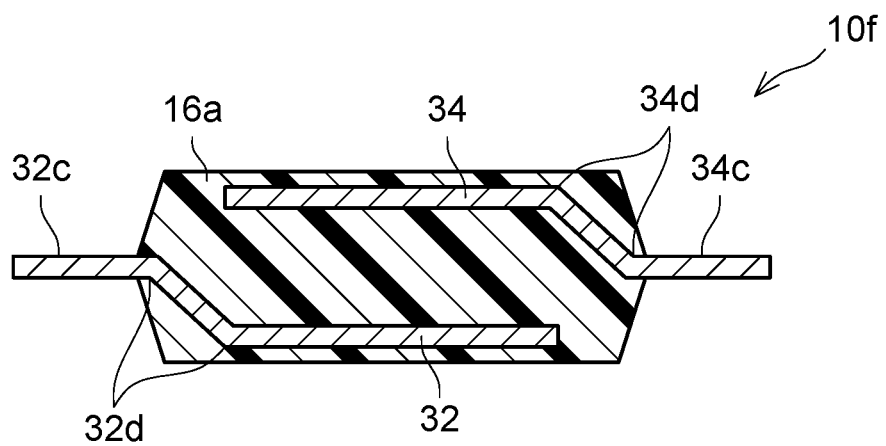
FIG. 25 is a cross-sectional view taken along a line XXV-XXV in FIG. 22, which illustrates a protruding end 32c of the first power terminal 32 and a protruding end 34c of the second power terminal 34 which protrude from a protrusion 16a of the encapsulant 16 in opposite directions to each other.

As illustrated in FIG. 22, and FIG. 25, in the semiconductor device 10f according to this variant, the first power terminal 32 and the second power terminal 34 respectively include a protruding end 32c and a protruding end 34c that protrude from the protrusion 16a of the encapsulant 16. Although not particularly limited, the protruding end 32c of the first power terminal 32 and the protruding end 34c of the second power terminal 34 protrude from the protrusion 16a of the encapsulant 16 along a common plane. When the protruding ends 32c and 34c that protrude from the encapsulant 16 are located in the common plane, the encapsulant 16 is easily formed by molding in manufacturing the semiconductor device 10. Further, when the first power terminal 32 and the second power terminal 34 include the protruding ends 32c and 34c, the connecting members 52 and 54 such as bus bars are easily connected to the first power terminal 32 and the second power terminal 34. As illustrated in FIG. 25, the first power terminal 32 and the second power terminal 32 respectively include bent portions 32d and bent portions 34d within the protrusion 16a of the encapsulant 16 such that the protruding ends 32c and 34c are located in the common plane. With such a configuration, deformation of the bent portions 32d and 34d is suppressed by the encapsulant 16. Thus, even when external force is applied to the protruding ends 32c and 34c, these two protruding ends 32c and 34c can be maintained in the common plane.

Figure 26:
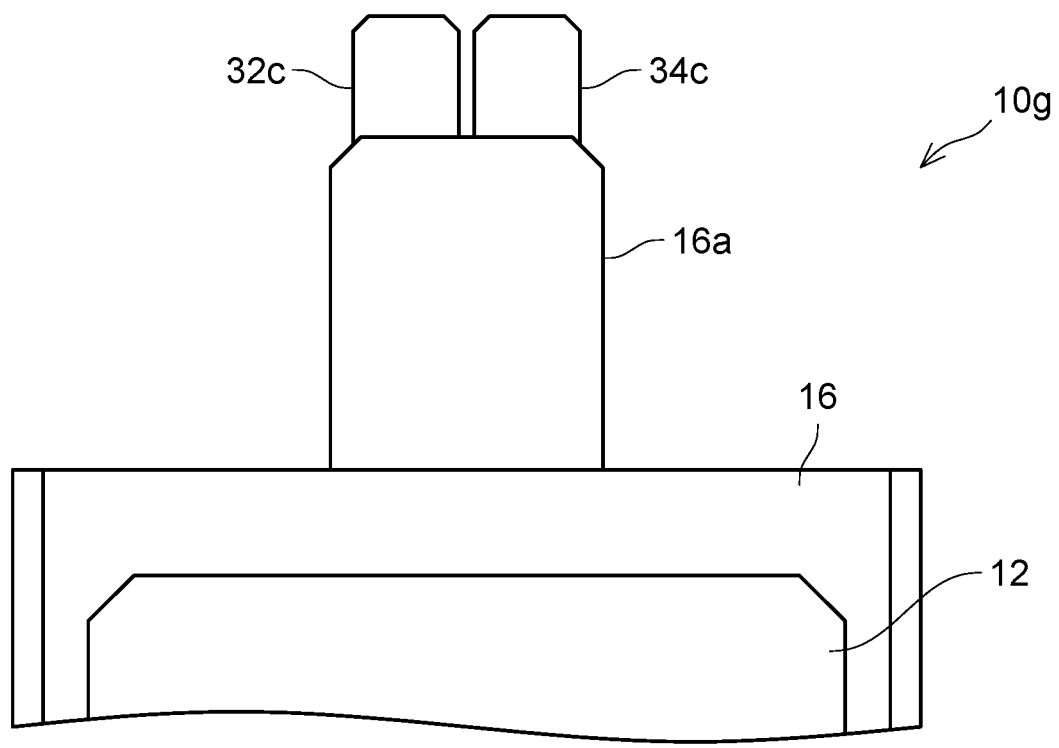
FIG. 26 is a front view illustrating a part of an external appearance of a semiconductor device 10g according to yet another variant, which illustrates the protruding end 32c of the first power terminal 32 and the protruding end 34c of the second power terminal 34 which protrude from the protrusion 16a of the encapsulant 16 in a same direction.

Next, with reference to FIG. 26, a semiconductor device 10g according to yet another variant will be described. In the semiconductor device 10f described above with reference to FIG. 22 to FIG. 25, the protruding end 32c of the first power terminal 32 and the protruding end 34c of the second power terminal 34 protrude from the protrusion 16a of the encapsulant 16 in different directions from each other. With such a configuration, since the two protruding ends 32c and 34c of the first power terminal 32 and the second power terminal 34 are arranged apart from each other, insulating property between the protruding ends 32c and 34c can be enhanced. In contrast, in the semiconductor device 10g illustrated in FIG. 26, the protruding end 32c of the first power terminal 32 and the protruding end 34c of the second power terminal 34 may protrude from the protrusion 16a of the encapsulant 16 in a same direction. With such a configuration, the protruding ends 32c and 34c of the first power terminal 32 and the second power terminal 34 can be connected respectively to the corresponding connecting members (such as bus bars) from a same direction.

Figure 27:
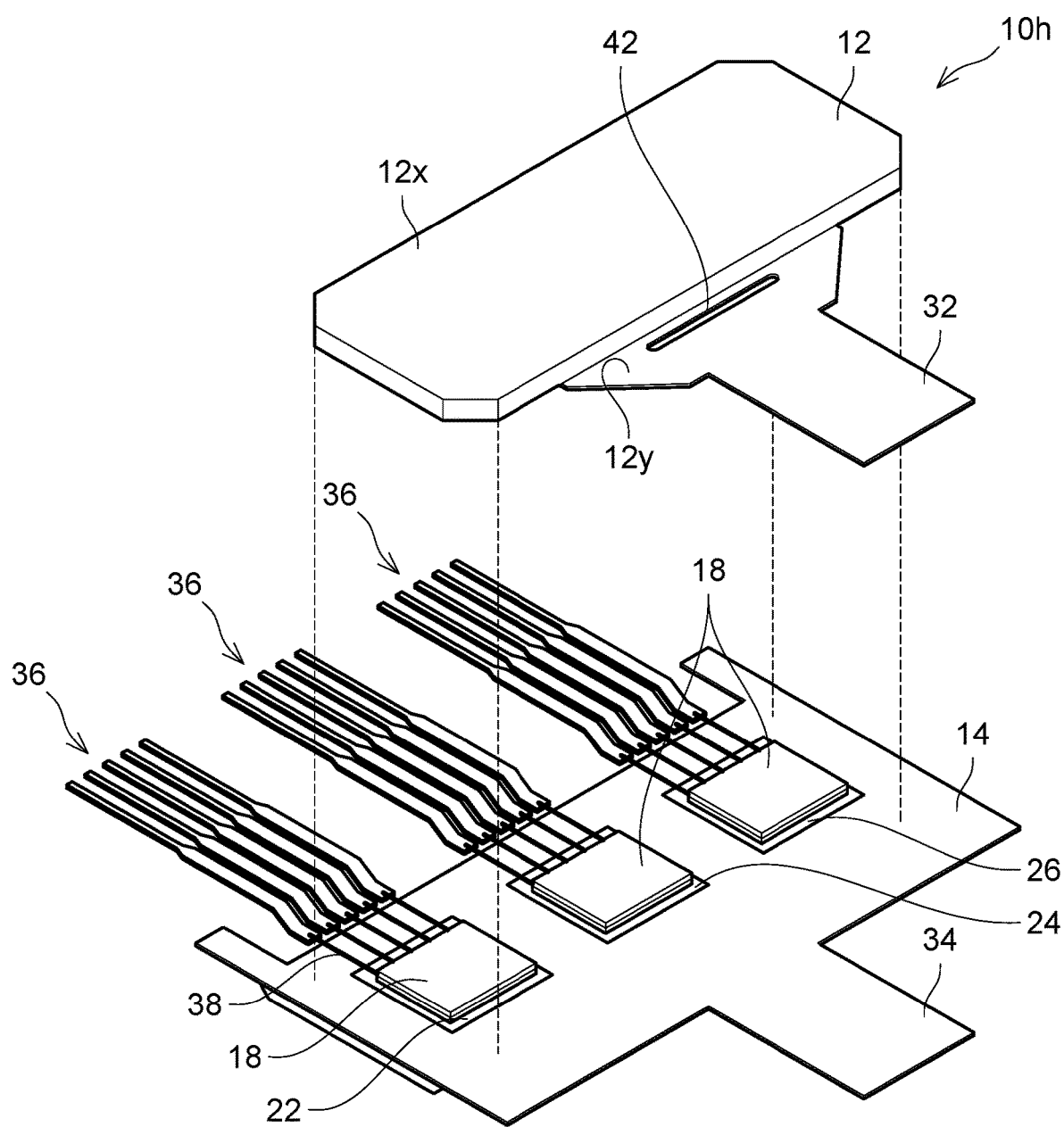
FIG. 27 is an exploded view illustrating an internal structure of a semiconductor device 10h according to yet another variant, which illustrates an opening 42 provided in a first conductor plate 12.

Next, with reference to FIG. 27, a semiconductor device 10h according to yet another variant will be described. As illustrated in FIG. 27, the semiconductor device 10h according to this variant is different from the semiconductor device 10 illustrated in FIG. 1 to FIG. 4 in that the first conductor plate 12 includes an opening 42. Other structures thereof are common to those of the semiconductor device 10 illustrated in FIG. 1 to FIG. 4, and hence the same reference signs are given thereto and redundant descriptions thereof will be omitted. The opening 42 provided in the first conductor plate 12 is located between the first power terminal 32 and the second semiconductor chip 24 of the plurality of semiconductor chips 22, 24, and 26, which is closest to the first power terminal 32. The opening 42 of the first conductor plate 12 is provided to equalize currents to flow through the three semiconductor chips 22, 24, and 26.

In other words, distances between the first power terminal 32 and the semiconductor chips 22, 24, and 26 are not completely equal to each other. For example, a distance from the first power terminal 32 to the first semiconductor chip 22 and a distance from the first power terminal 32 to the third semiconductor chip 26 are equal to each other. However, a distance from the first power terminal 32 to the second semiconductor chip 24 is shorter than any one of the distance from the first power terminal 32 to the first semiconductor chip 22 and the distance from the first power terminal 32 to the third semiconductor chip 26. When there are such differences in distance, non-negligible differences occur in electric resistances between the first power terminal 32 and the semiconductor chips 22, 24, and 26. As a result, currents flow through the semiconductor chips 22, 24, and 26 unequally.

In regard to the above problem, when the opening 42 is provided in the first conductor plate 12, at least a part of current that flows between the first power terminal 32 and the second semiconductor chip 24 inevitably skirts around the opening 42. As a result, a length of a path through which the current actually flows increases, and hence an electric resistance between the first power terminal 32 and the second semiconductor chip 24 increases. Since the current that flows through the second semiconductor chip 24 is thereby reduced, the inequality between the currents that flow through semiconductor chips 22, 24, and 26 is solved or reduced. The first conductor plate 12 includes a thick portion 12x and a thin portion 12y that is thinner than the thick portion 12x, and the opening 42 is located within the thin portion 12y. With such a configuration, the opening 42 is easily formed. In addition, when the encapsulant 16 is formed by molding, inside of the opening 42 is easily filled with the material of the encapsulant 16. The number of the opening 42 and a shape thereof may be changed as appropriate. Further, the opening 42 is not limited to a through hole, and may be a bottomed hole (that is, a recess).

Figure 28:
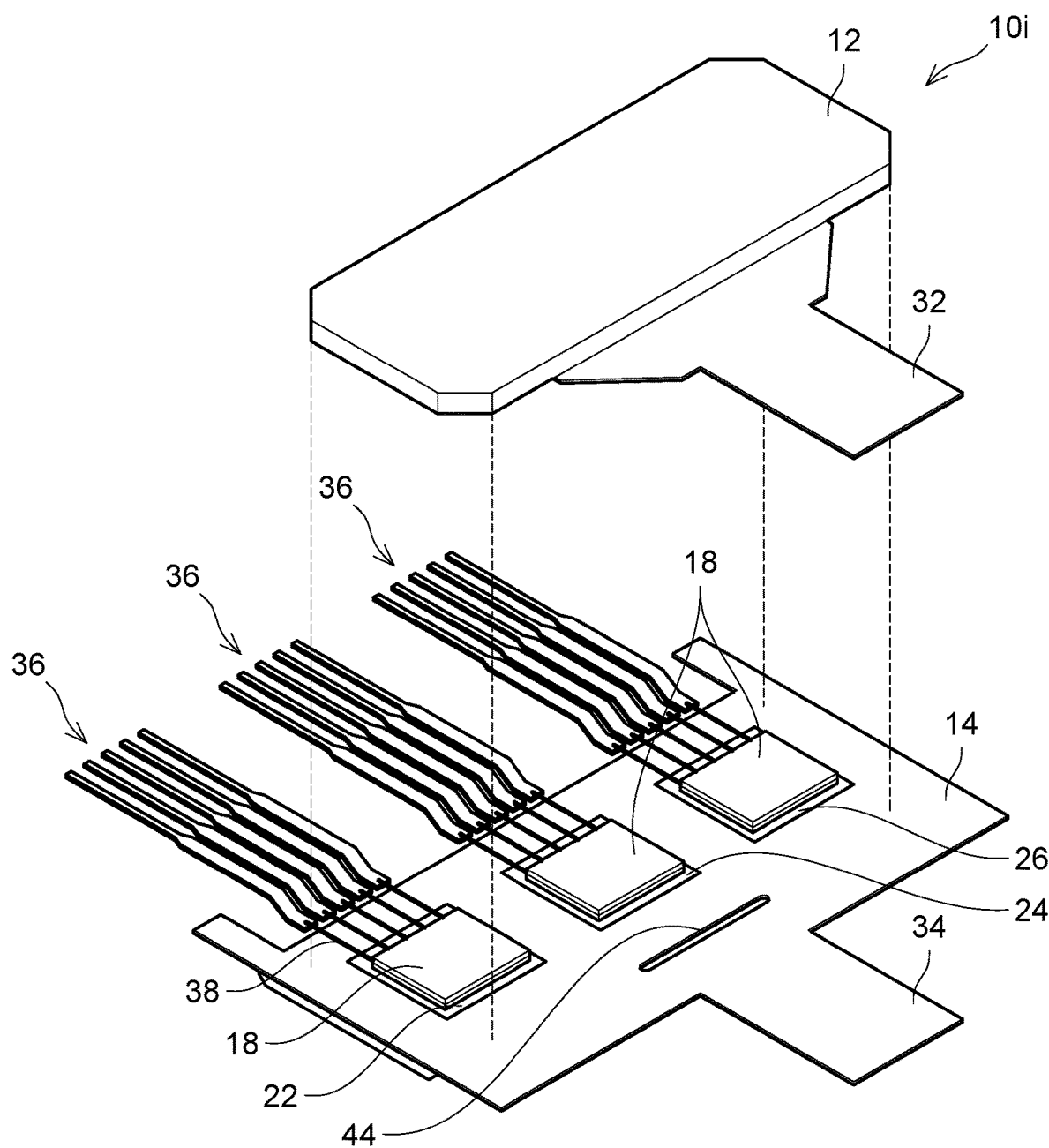
FIG. 28 is an exploded view illustrating an internal structure of a semiconductor device 10i according to yet another variant, which illustrates an opening 44 provided in a second conductor plate 14.

Next, with reference to FIG. 28, a semiconductor device 10i according to yet another variant will be described. As illustrated in FIG. 28, the semiconductor device 10i according to this variant is different from the semiconductor device 10h illustrated in FIG. 27 in that the second conductor plate 14 includes an opening 44, instead of the first conductor plate 12. Other structures thereof are common to those of the semiconductor device 10h illustrated in FIG. 27, and hence the same reference signs are given thereto and redundant descriptions thereof will be omitted. The opening 44 provided in the second conductor plate 14 is located between the second power terminal 34 and the second semiconductor chip 24 of the plurality of semiconductor chips 22, 24, and 26, which is closest to the second power terminal 34. The opening 44 of the second conductor plate 14 is also provided to equalize the currents to flow through the three semiconductor chips 22, 24, and 26. In other words, the opening 44 provided in the second conductor plate 14 brings the same operational effects as those of the opening 42 provided in the first conductor plate 12 of the semiconductor device 10h illustrated in FIG. 27.

In the semiconductor device 10i illustrated in FIG. 28, in addition to the opening 44 of the second conductor plate 14, the opening 42 (see FIG. 27) may be provided in the first conductor plate 12. In other words, the openings 42 and 44 may be provided respectively in the first conductor plate 12 and the second conductor plate 14. In this case, the opening 42 of the first conductor plate 12 and the opening 44 of the second conductor plate 14 may have a same size and a same shape with each other, or may have different sizes and shapes from each other. For example, the opening 42 of the first conductor plate 12 may have a larger size than that of the opening 44 of the second conductor plate 14. Alternatively, the opening 42 of the first conductor plate 12 may have a smaller size than that of the opening 44 of the second conductor plate 14.

What is claimed is:

1. A semiconductor device comprising:
   at least one semiconductor chip;
   an encapsulant encapsulating the at least one semiconductor chip;
   a first power terminal connected to the at least one semiconductor chip within the encapsulant and exposed to outside of the encapsulant; and
   a second power terminal electrically connected to the first power terminal via the at least one semiconductor chip within the encapsulant and exposed to the outside of the encapsulant,
   wherein
   the first power terminal and the second power terminal each have a plate shape and are at least partly opposed to each other within the encapsulant,
   the encapsulant comprises a protrusion extending along the first power terminal and the second power terminal, and
   the first power terminal and the second power terminal are at least partly opposed to each other within the protrusion.

2. The semiconductor device according to claim 1, wherein the first power terminal and the second power terminal are exposed along surfaces of the protrusion.

3. The semiconductor device according to claim 2, wherein the first power terminal and the second power terminal are exposed from the protrusion in opposite directions to each other.

4. The semiconductor device according to claim 2, wherein the first power terminal and the second power terminal are exposed from the protrusion in a same direction and at different positions in a longitudinal direction of the protrusion.

5. The semiconductor device according to claim 1, wherein each of the first power terminal and the second power terminal comprises a protruding end that protrudes from the protrusion of the encapsulant.

6. The semiconductor device according to claim 5, wherein the protruding end of the first power terminal and the protruding end of the second power terminal protrude from the protrusion of the encapsulant along a common plane.

7. The semiconductor device according to claim 6, wherein each of the first power terminal and the second power terminal comprises a bent portion within the protrusion of the encapsulant such that the protruding ends are located in the common plane.

8. The semiconductor device according to claim 5, wherein the protruding end of the first power terminal and the protruding end of the second power terminal protrude from the protrusion of the encapsulant in different directions from each other.

9. The semiconductor device according to claim 5, wherein the protruding end of the first power terminal and the protruding end of the second power terminal protrude from the protrusion of the encapsulant in a same direction.

10. The semiconductor device according to claim 1, wherein the at least one semiconductor chip includes a plurality of semiconductor chips.

11. The semiconductor device according to claim 10, further comprising:
a first conductor plate electrically connected to each of the plurality of semiconductor chips within the encapsulant; and
a second conductor plate opposed to the first conductor plate via the plurality of semiconductor chips and electrically connected to each of the plurality of semiconductor chips within the encapsulant,
wherein the first power terminal is electrically connected to the first conductor plate within the encapsulant, and
the second power terminal is electrically connected to the second conductor plate within the encapsulant.

12. The semiconductor device according to claim 11, wherein at least one of the first conductor plate and the second conductor plate comprises an opening located between a corresponding one of the first power terminal and the second power terminal and one of the plurality of semiconductor chips closest to the corresponding one of the first power terminal or the second power terminal.

13. The semiconductor device according to claim 12, wherein
the at least one of the first conductor plate and the second conductor plate comprises a thick portion and a thin portion that is thinner than the thick portion, and
the plurality of semiconductor chips is located on the thick portion and the opening is located within the thin portion.

14. The semiconductor device according to claim 1, wherein
the first power terminal comprises a first inner surface located within the encapsulant, the first inner surface being parallel with and located on a first plane,
the second power terminal comprises a second inner surface located within the encapsulant and opposed to the first inner surface of the first power terminal, the second inner surface being parallel with and located on a second plane that is parallel with the first plane, and
the at least one semiconductor chip is located between the first plane and the second plane.

15. The semiconductor device according to claim 14, wherein
the first power terminal comprises a first exposed surface exposed to the outside of the encapsulant,
the second power terminal comprises a second exposed surface exposed to the outside of the encapsulant, and
the first exposed surface and the second exposed surface are visible in a view perpendicular to the first and second planes.

16. The semiconductor device according to claim 14, wherein the at least one semiconductor chip includes a plurality of semiconductor chips located between the first plane and the second plane.

* * * * *